United States Patent
Kagarice et al.

(10) Patent No.: US 9,767,984 B2
(45) Date of Patent: Sep. 19, 2017

(54) CHICANE BLANKER ASSEMBLIES FOR CHARGED PARTICLE BEAM SYSTEMS AND METHODS OF USING THE SAME

(71) Applicant: FEI Company, Hillsboro, OR (US)

(72) Inventors: Kevin Kagarice, Portland, OR (US); Charles Otis, Hillsboro, OR (US); N. William Parker, Hillsboro, OR (US)

(*) Notice: Subject to any disclaimer, the term of this patent is extended or adjusted under 35 U.S.C. 154(b) by 0 days.

(21) Appl. No.: 14/502,099

(22) Filed: Sep. 30, 2014

(65) Prior Publication Data
US 2016/0093470 A1    Mar. 31, 2016

(51) Int. Cl.
*H01J 37/05*    (2006.01)
*H01J 37/04*    (2006.01)

(52) U.S. Cl.
CPC ........... *H01J 37/045* (2013.01); *H01J 37/05* (2013.01); *H01J 2237/004* (2013.01); *H01J 2237/028* (2013.01); *H01J 2237/057* (2013.01); *H01J 2237/15* (2013.01); *H01J 2237/28* (2013.01); *H01J 2237/31745* (2013.01); *H01J 2237/31749* (2013.01); *H01J 2237/32* (2013.01)

(58) Field of Classification Search
None
See application file for complete search history.

(56) References Cited

U.S. PATENT DOCUMENTS 4,358,680 A * 11/1982 Read .................. H01J 49/06
                                                       250/305
4,623,794 A * 11/1986 Rose .................. H01J 37/045
                                                       250/396 R (Continued)

FOREIGN PATENT DOCUMENTS

EP    0107320    5/1984
EP    2592642    5/2013

(Continued)

OTHER PUBLICATIONS

Gubbens, Alexander, et al., 'The GIF quantum, a next generation post-column imaging energy filter,' Ultramicroscopy, Jul. 2010, pp. 962-970, vol. 110, No. 8.
Uhlemann, S., et al., "Experimental Set-Up of a Fully Electrostatic Monochromator for a 200 kV TEM," The Proceedings of the 15th International Congress on Electron Microscopy, Sep. 1-6, 2002, 2 pgs.

(Continued)

*Primary Examiner* — Michael Logie
(74) *Attorney, Agent, or Firm* — Scheinberg & Associates, P.C.; John E. Hillert

(57) ABSTRACT

A chicane blanker assembly for a charged particle beam system includes an entrance and an exit, at least one neutrals blocking structure, a plurality of chicane deflectors, a beam blanking deflector, and a beam blocking structure. The entrance is configured to accept a beam of charged particles propagating along an axis. The at least one neutrals blocking structure intersects the axis. The plurality of chicane deflectors includes a first chicane deflector, a second chicane deflector, a third chicane deflector, and a fourth chicane deflector sequentially arranged in series between the entrance and the exit and configured to deflect the beam along a path that bypasses the neutrals blocking structure and exits the chicane blanker assembly through the exit. In embodiments, the chicane blanker assembly includes a two neutrals blocking structures. In embodiments, the beam blocking structure is arranged between the third chicane deflector and the fourth chicane deflector.

11 Claims, 10 Drawing Sheets

(56) References Cited

U.S. PATENT DOCUMENTS

| | | | | |
|---|---|---|---|---|
| 4,649,316 A * | 3/1987 | Cleaver | | H01J 37/045 250/281 |
| 4,755,685 A * | 7/1988 | Kawanami | | H01J 37/04 250/396 ML |
| 5,126,565 A | 6/1992 | Rose | | |
| 5,448,063 A | 9/1995 | de Jong et al. | | |
| 5,637,879 A * | 6/1997 | Schueler | | H01J 37/045 250/396 R |
| 5,798,524 A | 8/1998 | Kundmann et al. | | |
| 5,838,004 A | 11/1998 | Tiemeijer et al. | | |
| 6,218,664 B1 * | 4/2001 | Krans | | H01J 37/28 250/310 |
| 6,489,621 B1 | 12/2002 | Frosien | | |
| 6,501,076 B1 | 12/2002 | Kelly et al. | | |
| 6,822,246 B2 | 11/2004 | Bertsche | | |
| 7,034,315 B2 | 4/2006 | Henstra et al. | | |
| 7,326,925 B2 * | 2/2008 | Verentchikov | | H01J 49/406 250/281 |
| 7,999,225 B2 | 8/2011 | Henstra | | |
| 8,283,629 B1 * | 10/2012 | Tuggle | | H01J 37/05 250/305 |
| 8,294,093 B1 | 10/2012 | Tuggle et al. | | |
| 8,461,525 B2 | 6/2013 | Henstra | | |
| 2002/0109089 A1 * | 8/2002 | Krans | | H01J 37/12 250/310 |
| 2009/0114840 A1 * | 5/2009 | Ward | | H01J 27/26 250/423 F |
| 2010/0327180 A1 * | 12/2010 | Schwind | | H01J 37/05 250/396 R |
| 2012/0112090 A1 * | 5/2012 | Henstra | | H01J 37/05 250/396 R |
| 2012/0223244 A1 * | 9/2012 | Welkie | | H01J 37/12 250/396 ML |
| 2012/0312982 A1 * | 12/2012 | Webb | | H01J 49/403 250/282 |
| 2013/0112890 A1 * | 5/2013 | Parker | | H01J 37/05 250/396 R |
| 2013/0140450 A1 * | 6/2013 | Graupera | | H01J 37/05 250/282 |
| 2013/0193341 A1 * | 8/2013 | Ruan | | B82Y 10/00 250/396 R |
| 2013/0284593 A1 | 10/2013 | Shichi et al. | | |
| 2015/0279612 A1 * | 10/2015 | Yagita | | H01J 37/147 250/396 R |
| 2016/0013012 A1 * | 1/2016 | Sasaki | | H01J 37/045 250/492.3 |

FOREIGN PATENT DOCUMENTS

| | | | | |
|---|---|---|---|---|
| GB | 2446005 | | 7/2008 | |
| JP | 2011065904 A | * | 3/2011 | H01J 37/317 |

OTHER PUBLICATIONS

Benner, Gerd, et al., "Design and First Results of SESAM," Microscopy and Microanalysis, 2003, pp. 66-67, vol. 9, Suppl. 03.

Plies, Erich, et al., "Proposal of a Novel Highly Symmetric Wien Filter Monochromator," Microscopy and Microanalysis, 2003, pp. 28-29, vol. 9, Suppl. 03.

* cited by examiner

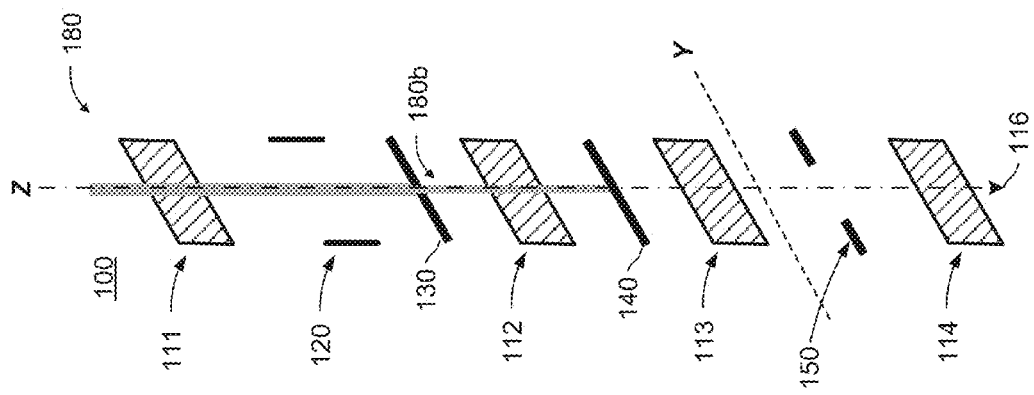
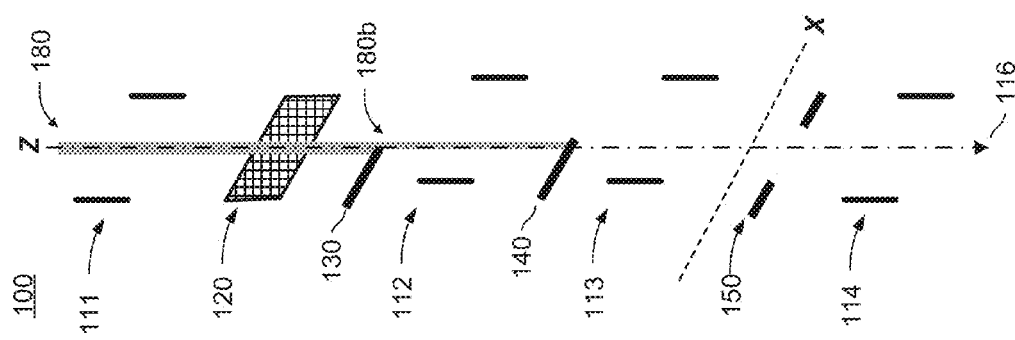
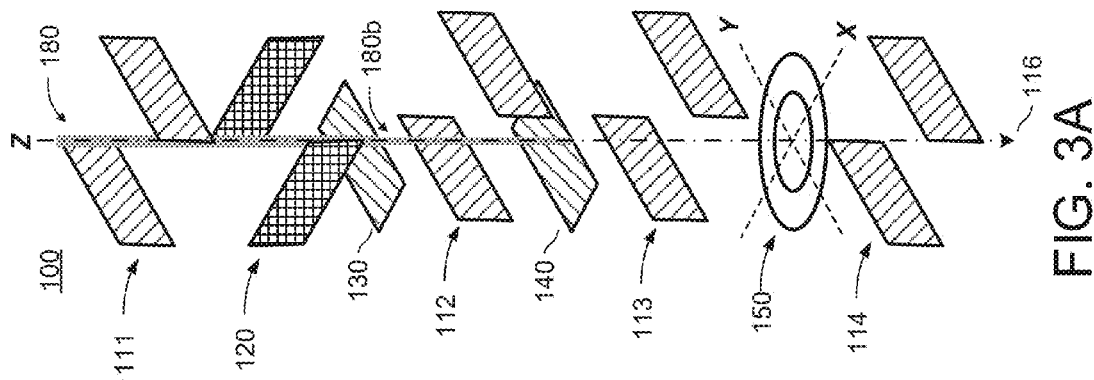

CHICANE BLANKER ASSEMBLIES FOR CHARGED PARTICLE BEAM SYSTEMS AND METHODS OF USING THE SAME

TECHNICAL FIELD

The present invention relates to methods, apparatuses, and systems for blanking charged particle beams, such as plasma-focused ion beams.

BACKGROUND

Focused ion beam (FIB) systems are used in a variety of applications in integrated circuit manufacturing and nanotechnology to create and alter microscopic and nanoscopic structures. FIB systems can use a variety of sources to produce ions, such as a plasma source or a liquid metal ion source (LMIS), which are then focused onto a sample for imaging and milling. In recent years, various FIB systems utilizing a plasma source to generate a plasma focused ion beams (P-FIBs) have been developed. P-FIB systems are capable of producing higher current focused ion beams than may typically be achieved by FIB systems utilizing other ion sources, such as liquid metal ion sources. The higher current focused ion beams of PFIB systems allow faster milling rates to be achieved in sample-processing applications, which may be particularly desirable, for example, in high-throughput sample-processing applications.

One issue encountered when using FIB systems, particularly P-FIB systems, is staining around areas of a sample irradiated with the plasma-focused ion beam. For example, a large circular stain, or "halo," may form around an impact point of the plasma-focused ion beam on the surface of a sample. It is believed that staining from plasma-focused ion beams arises from neutral particles ("neutrals) striking the sample and implanting into the sample material, or inducing deposition of contaminants, either directly or indirectly through generation of secondary electrons (SEs). The neutrals may be neutral particles leaked from the ion source of the FIB column and/or ions of focused ion beams that are neutralized in transit from the ion source to the sample. Compared to FIB devices utilizing LMIS sources, staining is significantly more pronounced in P-FIB systems because plasma sources operate at gas pressures orders of magnitude higher than a typical LMIS, and since P-FIBs are usually used to generate larger beam currents, the vacuum conductance of the larger beam-defining apertures (BDAs) allows more gas to leak down the column, eventually reaching the sample.

Thus, there is a need for new ways of preventing neutrals from reaching samples processed by single beam FIB columns. In particular, it would be desirable to find new apparatuses and methods for blocking neutrals generated by P-FIB systems from reaching samples processed by plasma focused ion beams generated therefrom to reduce or eliminate sample staining.

Image saturation is another issue encountered when P-FIB devices are used in dual beam systems. In dual-beam systems, comprising both a P-FIB column and a SEM column having optical axes intersecting at a common target, a typical work flow may constitute alternating P-FIB-milling steps with SEM imaging steps. During milling, the SEM beam is typically blanked while the P-FIB removes material by irradiating the sample. The P-FIB beam is then typically blanked, and the SEM beam is used to image the sample for end-pointing and other process-control functions. What has been discovered is that the plasma source, and also the P-FIB column, produce an appreciable flow of neutrals towards the sample, which cannot be blanked, deflected, or focused by the P-FIB column. When this neutral current strikes the sample during SEM imaging, it can induce secondary electron emission which may leave the sample and be detected by the imaging detector, causing image saturation. In some cases, particularly when the PFIB column has been configured to produce large ion currents, the neutral current may generate such a large background signal that "white-out" conditions are created, making SEM imaging is impossible.

Thus, there is a need for new ways of preventing neutrals from a FIB column of a dual beam FIB/SEM system from reaching samples during P-FIB milling, and also during SEM imaging while blanking the plasma-focused ion beam. In particular, it would be desirable to find new apparatuses and methods for blocking neutrals generated by P-FIB columns of dual beam P-FIB/SEM systems to reduce or eliminate staining when processing samples with plasma focused ion beams, and to reduce or eliminate image saturation when imaging samples with the SEM while blanking the P-FIB column.

SUMMARY

Disclosed herein, a chicane blanker assembly is provided for a charged particle beam system that includes an entrance and an exit, at least one neutrals blocking structure, a plurality of chicane deflectors, a beam blanking deflector, and a beam blocking structure. The entrance is configured to accept a beam of charged particles propagating along an axis. The at least one neutrals blocking structure intersects the axis. The plurality of chicane deflectors includes a first chicane deflector, a second chicane deflector, a third chicane deflector, and a fourth chicane deflector sequentially arranged in series between the entrance and the exit and configured to deflect the beam along a path that bypasses the neutrals blocking structure and exits the chicane blanker assembly through the exit. In embodiments, the chicane blanker assembly includes two neutrals blocking structures. In embodiments, the beam blocking structure is arranged between the third chicane deflector and the fourth chicane deflector. In embodiments, the beam blocking structure includes a faraday cup.

Also disclosed herein, a method is provided for preventing neutrals from impacting a sample while processing the sample with a charged particle system that includes a charged particle source and a chicane blanker assembly. The chicane blanker assembly includes first, second, third, and fourth chicane deflectors arranged in series, a first neutrals blocking structure, a second neutrals blocking structure, and a beam blocking structure disposed between the third and fourth chicane deflectors. The method includes irradiating a sample with a charged particle apparatus by emitting charged particles from a charged particle source, focusing the charged particles into a charged particle beam propagating towards the sample along a first axis, using the chicane deflectors to deflect the charged particle beam around the first neutrals blocking structure and the second neutrals blocking structure and then onto a second axis, the second axis being parallel to or the same as the first axis, and propagating the charged particle beam along the second axis such that the charged particle beam irradiates a surface of the sample; and preventing neutrals from impacting the sample using the chicane blanker assembly.

Also disclosed herein, a charged particle beam system for processing a workpiece is provided that includes a focused ion beam column configured to generate, focus, and direct an ion beam. The focused ion beam includes an ion source, an optical axis for propagating the ion beam from the ion source towards a workpiece, and a chicane blanker assembly. The chicane blanker assembly includes four chicane deflectors arranged in series, a blanking deflector, a first neutrals blocking structure, a second neutrals blocking structure, and a beam blocking structure. The first neutrals blocking structure is configured to block neutrals propagating towards the workpiece along the optical axis. The four chicane deflectors are configured to direct the beam onto the workpiece by deflecting the ion beam from the optical axis, onto a path bypassing the first neutrals blocking structure and the second neutrals blocking structure, and back onto the optical axis or an axis parallel to the optical axis. The four chicane deflectors and the blanking deflector are configured to blank the ion beam by deflecting the ion beam into the beam blocking structure. The second neutrals blocking structure is configured to block ions neutralized after being deflected from the optical axis. In embodiments, the ion source is a plasma ion source.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present disclosure, and advantages thereof, reference is now made to the following descriptions taken in conjunction with the accompanying drawings, in which:

FIG. 3A is an isometric view of the chicane blanker assembly of FIG. 1A shown blanking neutrals according to an embodiment of the disclosure.

FIG. 3B is an isometric view of the half-section of the chicane blanker assembly of FIG. 3A behind the X-Z plane.

FIG. 3C is an isometric view of the half-section of the chicane blanker assembly of FIG. 3A behind the Y-Z plane.

DETAILED DESCRIPTION

Figure 1A:
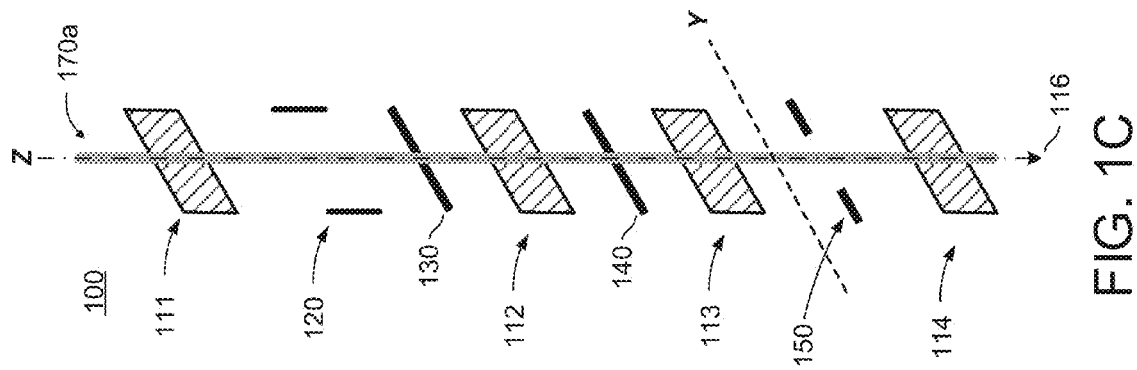
FIG. 1A is an isometric view of a chicane blanker assembly operating in an unblanked mode according to an embodiment of the disclosure.

In the drawings and description that follow, like parts are typically marked throughout the specification and drawings with the same reference numerals, respectively. In addition, similar reference numerals may refer to similar components in different embodiments disclosed herein. The drawing figures are not necessarily to scale. Certain features of the invention may be shown exaggerated in scale or in somewhat schematic form and some details of conventional elements may not be shown in the interest of clarity and conciseness. The present invention is susceptible to embodiments of different forms. Specific embodiments are described in detail and are shown in the drawings, with the understanding that the present disclosure is not intended to limit the invention to the embodiments illustrated and described herein. It is to be fully recognized that the different teachings of the embodiments discussed herein may be employed separately or in any suitable combination to produce desired results.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. Furthermore, use of the term "and/or" herein shall be construed as an "inclusive" or, and not an "exclusive" or. For example, used herein the phrase "A and/or B" would mean "A, B, or A and B." As another example, used herein the phrase "A, B, and/or C" would mean "A, B, C, or any combination thereof." Further, whenever the terms "automatic," "automated," or similar terms are used herein, those terms will be understood to include manual initiation of the automatic or automated process or step.

Unless otherwise specified, use of the terms "connect," "engage," "couple," "attach," or any other like term describing an interaction between elements is not meant to limit the interaction to direct interaction between the elements and may also include indirect interaction between the elements described. The term "charged particle beam" and "beam of charged particles" are synonymous.

The term "source" is used herein to refer to a source of charged particles. The term "target" refers to an object to be irradiated by a charged particle beam formed from charged particles of the source. Further, unless indicated otherwise, reference made herein to "a sample," "a specimen," "a substrate," or "a workpiece" is also a reference to a target. That is, samples, specimens, substrates, and workpieces are mentioned herein as embodiments of different targets.

Unless indicated otherwise, the term "upstream" is used herein to refer to a first position that is closer to an origin than a second position in a space between the origin and a destination. Unless indicated otherwise, the term "downstream" is used herein to refer to a first position that is closer to a destination than a second position in a space between an origin and a destination. The identity of the origin will be apparent from the context. In some instances, the origin and destination are, respectively, an entrance and an exit of a structure through which a charged particle beam is passed. In other instances, the origin and destination are, respectively, a source and a target. To illustrate the usage of upstream and downstream, consider a charged particle system comprising a charged particle source S and a target T to be irradiated by a charged particle beam emitted from source S. A structure U is upstream of a structure D if structure U is closer to source S than structure D in the space between source S and target T. Structure D is downstream of structure U if structure D is closer to target T than structure U in the space between source S and target T.

In some cases, it may be desirable to block the transmission of neutrals down a FIB column, such as a P-FIB column, towards a sample. Disclosed herein, is a chicane blanker assembly (CBA), which may be used in conjunction with or as part of a charged particle system.

In various embodiments, the CBA may include an entrance, an exit, one or more neutrals blocking structures arranged to obstruct neutrals propagating in the CBA towards the exit, a beam blanking deflector, a beam blocking structure, and a plurality of chicane deflectors. The entrance is configured to accept a charged particle beam propagating along an axis towards the CBA. The beam blanking deflector is disposed downstream of the entrance and upstream of the beam blocking structure, and the beam blocking structure is disposed upstream of the exit. The beam blanking deflector is configured to deflect a charged particle beam into the beam blocking structure when the CBA is operated in a blanking mode. The plurality of deflectors is disposed in series between the entrance and the exit and is configured to deflect the charged particle beam along a path that bypasses the one or more neutrals blocking structure and exits the chicane blanker assembly through the exit when the CBA is operated in an unblanked mode. For simplicity, embodiments of the CBA described herein comprise four chicane deflectors. However, embodiments of the CBA may utilize a greater or fewer number chicane deflectors to achieve the functionality of the CBA described herein.

The CBA may be configured to operate in a blanking mode, an unblanked mode, or a combination thereof. In various embodiments, the CBA is configured to switch between a blanking mode and an unblanked mode.

In the blanking mode, the beam blanking deflector utilizes the beam blanking deflector and, optionally, one or more of the chicane deflectors to prevent a charged particle beam from passing through the exit by deflecting the beam into the beam blocking structure. In some embodiments, the beam blocking structure and one or more of the plurality of deflectors are configured to cooperatively deflect a charged particle beam into the beam blocking structure. In an embodiment, the beam blanking deflector and the first chicane deflector are configured to cooperatively apply electrostatic fields to a charged particle beam such that the charged particle beam is deflected into the beam blocking structure. As used herein, the term "first chicane deflector" refers to the deflector of a specified plurality of chicane deflectors that is closest to the entrance of the CBA.

In the unblanked mode, the CBA is configured to operate to deflect a charged particle beam along a path that bypasses the one or more neutrals blocking structure and exits the chicane blanker assembly through the exit of the CBA. In some such embodiments, the plurality of chicane deflectors includes four chicane deflectors sequentially arranged in series between the entrance and the exit and a beam blocking structure is arranged between the third chicane deflector and the fourth chicane deflector. The one or more neutrals blocking structures intersect the longitudinal axis of the CBA and the four chicane deflectors are configured to deflect a charged particle beam along a path that bypasses the one or more neutrals blocking structure and exits the chicane blanker assembly through the exit of the CBA. As used herein, the "longitudinal axis" of the CBA refers to an axis joining an approximate center point of the cross-section of the entrance of the CBA and an approximate center point of the cross-section of the exit of the CBA. In such embodiments, the chicane deflectors utilize electrostatic fields to deflect the charged particle beam around the one or more neutrals blocking structure. Because the trajectories of neutrals are not affected by electrostatic fields, the chicane deflectors do not alter the course of neutrals propagating towards the exit in the space between the entrance and the one or more neutrals blocking structures. As such, the neutrals collide with one or more neutrals blocking structures and are prevented from exiting the CBA with the charged particle beam.

The one or more neutrals blocking structures may include any structure suitable for obstructing (e.g., physically obstructing) neutrals propagating along a path that intercepts one of the one or more neutrals blocking structures. In various embodiments, the neutrals blocking structure is impenetrable or substantially impenetrable to neutrals having kinetic energies typical of those generated by P-FIB columns. In various embodiments, the CBA utilizes one or more plates as neutrals blocking structures.

In various embodiments, CBA includes a first neutrals blocking structure. In some such embodiments, the CBA includes four chicane deflectors sequentially arranged in series between the entrance and the exit, a first neutrals blocking structure disposed upstream of the fourth chicane deflector, and a beam blocking structure arranged between the third chicane deflector and the fourth chicane deflector. In some such embodiments, the first neutrals blocking structure is disposed upstream of the fourth chicane deflector, and downstream of the end of the first chicane deflector closest to the entrance of the CBA. In some such embodiments, the first neutrals blocking structure is disposed between the beam blanking deflector and the second chicane deflector, and the beam blocking structure is disposed between the third chicane deflector and the fourth chicane deflector. In some embodiments, the first neutrals blocking structure intersects an axis along which a charged particle beam enters the CBA, and the four chicane deflectors are configured to deflect the charged particle beam around the first neutrals blocking structure. In some such embodiments, the size, shape, and arrangement of the first neutrals blocking structure are such that the first neutrals blocking structure would completely block charged particle beams propagating from the entrance of the CBA to the first neutrals blocking structure along the longitudinal axis of the CBA. In some such embodiments, the size, shape, and arrangement of the first neutrals blocking structure are such that the first neutrals blocking structure would completely block charged particle beams propagating from the entrance of the CBA to the first neutrals blocking structure along the longitudinal axis of the CBA and having diameters of less than or equal to about 1 millimeter (mm).

In various embodiments, the CBA includes the first neutrals blocking structure and a second neutrals blocking structure. In some such embodiments, the first neutrals blocking structure is disposed between the beam blanking deflector and the second chicane deflector, the second neutrals blocking structure is disposed between the second chicane deflector and third chicane deflector, and the beam blocking structure is disposed between the third chicane deflector and the fourth chicane deflector. In some such embodiments, the second neutrals blocking structure blocks a portion of a latitudinal cross section of the CBA in a direction of charged particle beam deflection achieved in the blanking mode, the unblanked mode, or a combination thereof, the portion blocked by the second neutrals blocking structure not overlapping the portion of the first neutrals blocking structure when the CBA is viewed through the entrance and/or the exit from outside of the CBA. In such embodiments, the four chicane deflectors are arranged and configured to deflect, in unblanked mode, a charged particle beam around the first and the second neutrals blocking structure and out of the CBA through the exit. Additionally or alternatively, the first chicane deflector, the beam blanking deflector, and, optionally, one or more of the second, third, and fourth chicane deflectors are arranged and configured to deflect, in blanking mode, a charged particle beam past the first and the second neutrals blocking structure and into the beam blocking structure. The second neutrals blocking structure may advantageously prevent neutrals from passing through the exit by blocking neutrals that would not have otherwise been blocked by the first neutrals blocking structure. For example, neutrals may be generated from charged particles of the charged particle beam as the charged particle beam propagates from the around the first and second neutrals blocking structures, in the unblanked mode, and as the charged particle beam is deflected off-axis and towards the beam blocking structure in the blanking mode. A neutral generated from a charged particle at one of these points will have a different trajectory based on the trajectory of the charged particle at the time of conversion, a trajectory based on the interaction causing neutralization of the charged particle, a trajectory based on collisions of the neutral after conversion or a combination thereof. The different trajectory may take neutral particle past the first neutrals blocking detector, but may be blocked by the second neutrals blocking detector which provides an area across the cross-section of the CBA that is offset from the first neutrals blocking detector. In various embodiments, an offset of the second neutrals blocking structure covers a cross-sectional area of the CBA in the direction of beam deflection not covered by the first neutrals blocking structure. It is believed that neutrals generated from charged particles of the charged particle beam after deflection of the charged particle beam will have new trajectories that tend to propagate in the direction of the beam deflection.

Deflectors suitable for the chicane deflectors and the beam blanking deflector may be any devices suitable for deflecting charged particle beams in applications utilizing charged particle apparatuses. In various embodiments, the deflectors are configured to apply one or more types of forces capable of preferentially and/or selectively deflecting charged particles over neutrals. Forces suitable for preferentially and/or selectively deflecting charged particles over neutrals include, but are not limited to, electrostatic forces created between charged particles and electrostatic fields generated between electrodes disposed on opposite sides of a charged particle beam. For illustrative purposes, the various embodiments of the CBA are described herein as utilizing electrostatic deflectors comprising two or more electrodes disposed about a charged particle beam pathway such that an electrostatic field can be generated across the beam pathway. However, for each of the embodiments disclosed herein, other types of deflectors suitable for preferentially and/or selectively deflecting charged particles over neutrals may be substituted for one or more of the chicane deflectors and the beam blanking deflector.

In some embodiments, the position of the beam blocking structure is offset from the longitudinal axis of the CBA such that electrostatic fields from the beam blanking deflector and the first chicane deflector must be applied simultaneously to deflect the beam sufficiently enough for it to collide with the beam blocking structure. When the plurality of chicane deflectors are operated alone (e.g., no electrostatic field is applied by the beam blanking deflector), a charged particle beam may pass through the CBA along the path bypassing the one or more beam blocking structures. When the plurality of chicane deflectors are operated concurrently with the beam blanking deflector the combined fields deflect the charged particle beam into the beam blocking structure.

The beam blanking deflector functions to deflect charged particle beams directed into the CBA onto a path terminating at the beam blocking structure. In various embodiments, the beam blanking deflector and the first chicane deflector, alone or in combination with one or more of the second, third, and fourth chicane deflectors, are configured to deflect charged particle beams into the beam blocking structure when the CBA is operated in a beam blanking mode.

The beam blanking deflector and the first chicane deflector may be configured to apply forces to a charged particle beam when the CBA is operated in blanking mode in the same direction, in different directions, or a combination thereof. In such embodiments, the sum of the forces applied charged particle beam directions the charged particle beam into the beam blocking structure, thereby blanking the charged particle beam.

In some embodiments, beam blanking deflector and the first chicane deflector are arranged to generate electrostatic fields in a same direction across a charged particle beam path. In some such embodiments, the first chicane deflector is configured to generate an electrostatic field suitable for deflecting a charged particle beam in a first direction, the first direction being perpendicular to the longitudinal axis of the CBA, and the beam blanking deflector is configured to apply an electrostatic field suitable for deflecting a charged particle beam in the first direction.

Different arrangements of the beam blanking deflector relative to the first chicane deflector may be utilized to carry out same direction beam blanking deflections. In some embodiments, the beam blanking deflector is downstream of the first chicane deflector, and the beam blanking deflector and the first chicane deflector each comprise a pair of electrodes oppositely disposed about the longitudinal axis of the CBA in the same plane.

In other embodiments, the beam blanking deflector and the first chicane deflector each comprise two electrodes oppositely disposed at the same radial positions around the longitudinal axis and at the same distance from the entrance of the CBA. By placing the electrodes of the beam blanking deflector and the first chicane deflector at the same radial positions, the beam blanking deflector and first chicane deflector can apply fields in the same direction. In one such embodiments, the two oppositely disposed electrodes of the beam blanking deflector are situated between the at least two oppositely disposed electrodes of the first chicane deflector such that an outside surface of each electrode of the beam blanking deflector faces an inside surface of one of the oppositely disposed electrodes of the first chicane deflector. In another such embodiment, the two oppositely disposed electrodes of the first chicane deflector are situated between the at least two oppositely disposed electrodes of the beam blanking deflector such that an outside surface of each electrode of the first chicane deflector faces an inside surface of one of the oppositely disposed electrodes of the beam blanking deflector. In an embodiment, the first chicane deflector and the beam blanking deflector are a same deflector and include a voltage source configured to apply a first voltage to the same deflector sufficient to deflect the beam along a path bypassing the first chicane deflector, and apply a second voltage to the same deflector sufficient to deflect the beam along a path that bypasses the first chicane deflector and terminates in the beam blocking structure.

In various embodiments, the beam blanking deflector and the first chicane deflector are arranged to apply electrostatic fields across a charged particle beam path in the CBA in directions perpendicular to one another and perpendicular to a longitudinal axis of the CBA. In some such embodiments, the first chicane deflector is configured to apply an electrostatic force to a charged particle beam in a direction that is perpendicular to the longitudinal axis of the CBA and the beam blanking deflector is configured to apply an electrostatic to the charged particle beam in a direction that is perpendicular to both the longitudinal axis of the CBA and the electrostatic force applied to the charged particle beam by the first chicane deflector.

Different arrangements of the beam blanking deflector relative to the first chicane deflector may be utilized to create perpendicular forces across the charged particle beam path. In some embodiments, the beam blanking deflector is downstream of the first chicane deflector, the beam blanking deflector and the first chicane deflector each comprise a pair of electrodes oppositely disposed about the longitudinal axis of the CBA, the electrodes of the beam blanking deflector and the longitudinal axis lie in a first plane, the electrodes of the first chicane deflector lie on a second plane, the first plane intersects the second plane along a line that overlaps or is parallel to the longitudinal axis of the CBA, and the first plane is perpendicular to the second plane. In other words, the beam blanking deflector is downstream of the electrodes of first chicane deflector are rotated 90 degrees about the longitudinal axis of the CBA from the electrodes of the beam blanking deflector. An embodiment of this arrangement is shown in FIGS. 1-3 described below.

In other embodiments, the beam blanking deflector and the first chicane deflector are disposed downstream of the entrance of the CBA at the same point along the longitudinal axis of the CBA. In some such embodiments, the CBA comprises a quadrupole deflector that functions as both the beam blanking deflector and the first chicane deflector. The quadrupole deflector comprises four electrodes circumferentially arranged around the longitudinal axis of the CBA and spaced apart from one another at 90 degree intervals. The first and third quadrupole electrodes are disposed on opposite sides of the longitudinal axis of the CBA and function as the first chicane deflector. The second and fourth quadrupole electrodes are disposed on opposite sides of the longitudinal axis of the CBA and function as the beam blanking deflector. Alternatively, the chicane and blanking functionality may not be restricted to particular pairs of electrodes. For example, the quadrupole may be capable of carrying out the deflections required for both the unblanked mode and the beam blanking mode using just one pair of electrodes.

The arrangement of the quadrupole electrodes allows the quadrupole to generate deflections suitable for the unblanked mode and other deflections suitable for the blanking mode. When the CBA is operated in unblanked mode, the quadrupole generates an electrostatic field suitable for deflecting a charged particle beam from the quadrupole to other energized chicane deflectors downstream. When the CBA is operated in blanking mode, the quadrupole may generate two perpendicular electrostatic fields using both pairs of electrodes, the two electrostatic fields simultaneously carrying out the first chicane deflector and the beam blanking deflector deflections. In some embodiments, the quadrupole is configured to carry out the deflections of the first chicane deflector and the beam blanking deflector using only one of the pairs of electrodes. The single pair and double pair deflections may be carried out by applying voltages to the appropriate deflectors at strengths and polarities sufficient to achieve the desired deflection.

In various embodiments, the first chicane deflector is configured to apply an electrostatic field across a beam path of the CBA in a first direction perpendicular to the beam path and the beam blanking deflector is configured to apply an electrostatic field across the beam path in a second direction, wherein an angle between the first direction and the second direction is in a range of greater than about 0° and less than about 90 degrees. Different arrangements of the beam blanking deflector relative to the first chicane deflector may be utilized to create these non-parallel non-perpendicular forces. In a first exemplary embodiment, the beam blanking deflector is downstream of the first chicane deflector, the beam blanking deflector and the first chicane deflector each comprise a pair of electrodes oppositely disposed about the longitudinal axis of the CBA, the electrodes of the beam blanking deflector and the longitudinal axis lie in a first plane, the electrodes of the first chicane deflector lie in a second plane, the first plane intersects the second plane along a line that overlaps or is parallel to the longitudinal axis of the CBA at an angle in a range of greater than about 0° and less than about 90 degrees. In a second exemplary embodiment, the beam blanking deflector and the first chicane deflector are disposed downstream of the entrance of the CBA at the same point along the longitudinal axis of the CBA, and oriented as in the first exemplary embodiment.

The beam blocking structure may be any structure suitable for blanking a charged particle beam when the CBA is operated in blanking mode. In various embodiments, the beam blocking structure is disposed between the third and fourth chicane deflectors. In various embodiments, the beam blocking structure may terminate charged particle beams that collide with the beam blocking structure. In various embodiments, the beam blocking reflects charged particle beams that collide with the beam blocking structure in a direction away from the exit of the CBA.

In various embodiments, the beam blocking structure comprises a cup-shaped structure having an inlet defined by an upper edge of a cylindrical outer wall, a bottom plate mated with the bottom edge of the cylindrical wall, and an outlet aperture through the bottom plate. The inlet is wide enough to accept charged particle beams deflected according to either the blanking or the unblanked mode. The outlet aperture is sized and located such that charged particle beams pass through the outlet aperture when the CBA operates in unblanked mode and that intersect the bottom plate when the CBA operates in blanking mode. In some embodiments, the bottom plate has an annular channel that opens towards the inlet and is sized and positioned such that a charged particle beam enters the annular channel and collides with a bottom face of the annular channel when the CBA is operated in blanking mode.

In various embodiments, the beam blocking structure comprises a Faraday cup. In some such embodiments, the Faraday cup is positioned between the third chicane deflector and the fourth chicane deflector in a position where charged particle beams will enter the Faraday cup when the CBA is operated in blanking mode, and where charged particle beams will be directed around the one or more neutrals blocking structures, past the Faraday cup, and out of the exit of the CBA when operated in unblanked mode.

Embodiments of the chicane blanker assembly may be utilized to filter and/or block neutrals generated by a charged particle beam system. In various embodiments, the charged particle system comprises a FIB column equipped with the CBA and configured to pass focused ion beams into entrance of the CBA and towards a workpiece. In some such embodiments, the FIB column is a P-FIB column.

In various embodiments, the charged particle system is a dual beam apparatus comprising a SEM and a FIB column, the FIB column being equipped with the CBA and configured to pass focused ion beams into entrance of the CBA and towards a sample and/or workpiece. In some embodiments, the CBA may be configured to switch between a blanking mode and an unblanked mode. In some embodiments the CBA is configured to operate in a blanking mode as a workpiece is imaged by the SEM and alternately in an unblanked mode so that the focused ion beams may be used to process the workpiece. In some such embodiments, the FIB column is a P-FIB column.

Figure 1B:
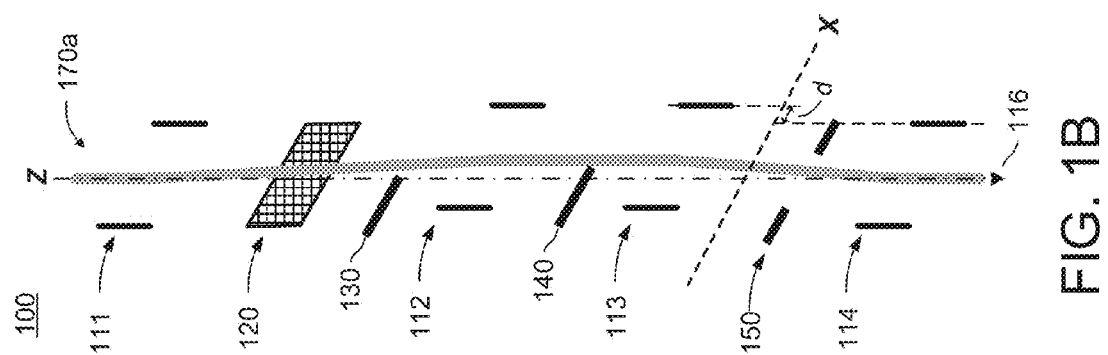
FIG. 1B is an isometric view of the half-section of the chicane blanker assembly of FIG. 1A behind the X-Z plane.
Figure 1C:
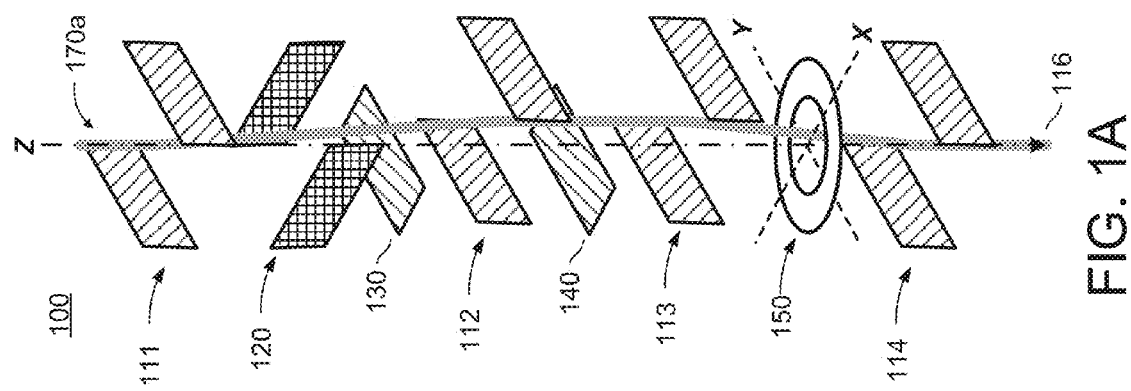
FIG. 1C is an isometric view of the half-section of the chicane blanker assembly of FIG. 1A behind the Y-Z plane.
Figure 2C:
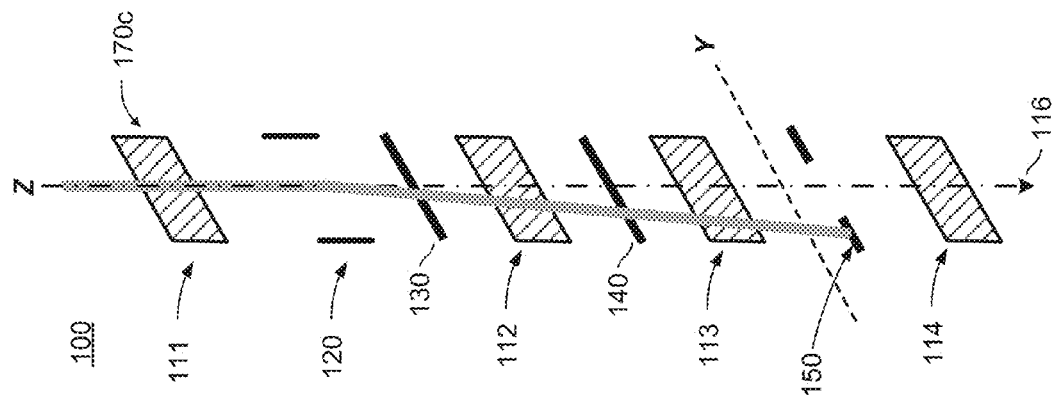
FIG. 2C is an isometric view of the half-section of the chicane blanker assembly of FIG. 2A behind the Y-Z plane.
Figure 2B:
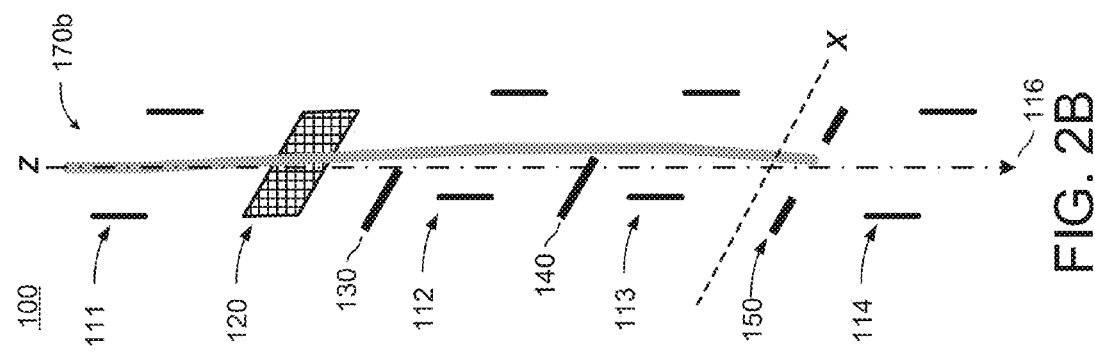
FIG. 2B is an isometric view of the half-section of the chicane blanker assembly of FIG. 2A behind the X-Z plane.
Figure 2A:
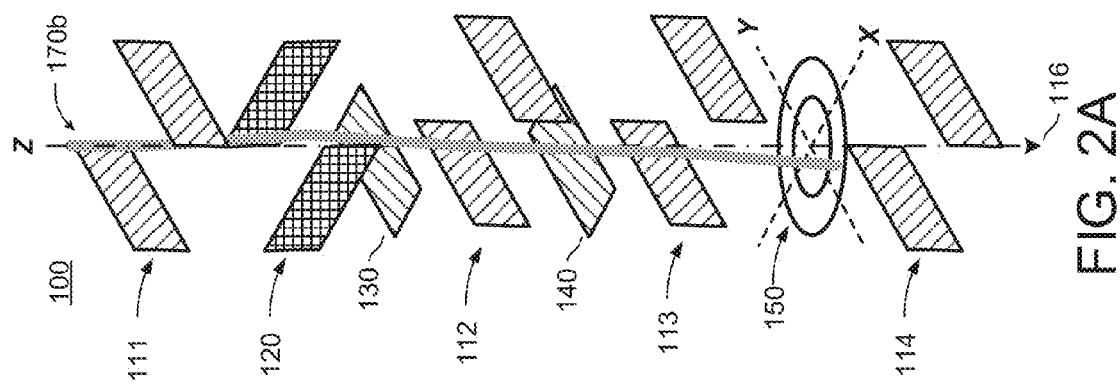
FIG. 2A is an isometric view of the chicane blanker assembly of FIG. 1A operating in a blanking mode according to an embodiment of the disclosure.

Turning now to FIGS. 1A-1C, 2A-2C, and 3A-3C, a chicane blanker assembly 100 according to an embodiment of the disclosure is shown. FIGS. 1A, 2A, and 3A show isometric views of CBA 100; FIGS. 1B, 2B, and 3B show isometric views of the half-section of the CBA 100 of FIGS. 1A, 2A, and 3A behind the X-Z plane; and FIGS. 1C, 2C, and 3C show isometric views of the half-section of the CBA 100 of FIGS. 1A, 2A, and 3A behind the Y-Z plane.

In order from top to bottom, CBA 100 includes first chicane deflector 111, beam blanking deflector 120, first neutrals blocking structure 130, second chicane deflector 112, second neutrals blocking structure 140, third chicane deflector 113, beam blocking structure 150, and fourth chicane deflector 114. The chicane deflectors 111, 112, 113, 114 and beam blanking deflector 120 each comprise a pair of electrodes oppositely disposed across the Z-axis and configured to deflect charged particle beams propagating inside CBA 100 approximately in the direction of arrow 116 by generating electrostatic fields across the path of the charged particle beam. Chicane deflectors 112 and 113 are offset from chicane deflectors 111 and 114 by a distance d from the Z-axis, shown in FIG. 1B. Also shown in FIG. 1B, neutrals blocking structure 130 extends across the path of the Z-axis, and neutrals blocking structure 140 extends across the beam path and further in the direction of the beam offset by a distance d or less. In an embodiment, an area of neutrals blocking structure 140 is cantilevered across a longitudinal cross-section of CBA 100 corresponding to the offset between chicane deflectors 112, 113 and deflectors 111, 114.

CBA 100 can be operated in an unblanked mode and, alternately, in a blanking mode. In unblanked mode, a charged particle beam enters CBA 100, is deflected around neutrals blocking structures 130, 140, passes through beam blocking structure 150, and exits CBA 100 at the other end. In blanking mode, a charged particle beam enters CBA 100, but is deflected along a path terminated by beam blocking structure 150. In either mode, neutrals propagating with the charged particle beam are blocked by neutrals blocking structures 130 and 140.

FIGS. 1A-1C show CBA 100 operating in the unblanked (beam pass-through) mode. Charged particle beam 170a enters CBA 100 along the Z-axis and is deflected by chicane deflectors 111, 112, 113, 114 along a route bypassing neutrals blocking structures 130 and 140, passing through beam blocking structure 150, and exiting CBA 100 below chicane deflector 114. Ion beam 170a is first deflected by first chicane deflector 111 in the direction of the X-axis at a point before the Z-axis meets neutrals blocking structure 130. Ion beam 170a is then deflected by second chicane deflector 112 onto a second axis parallel to the Z-axis. The second axis is offset from the Z-axis by a distance sufficient for charged particle beam 170a to avoid being intercepted by neutrals blocking structure 140. At the third chicane deflector 113, charged particle beam 170a is deflected back towards the Z-axis along a path passing through beam blocking structure 150. At chicane deflector 114, charged particle beam 170a is deflected on a third axis parallel to the Z-axis. Ion beam 170a then exits CBA 100 along the third axis. In an embodiment, the third axis overlaps the Z-axis (i.e., charged particle beam 170a exits CBA 100 on the Z-axis).

FIGS. 2A-2C show CBA 100 operating in the blanking mode. In blanking mode, blanking deflector 120 and chicane deflectors 111, 112, and 113 deflect charged particle beam 170b along a path bypassing neutrals blocking structures 130 and 140 and terminating at beam blocking structure 150. Ion beam 170b is first deflected by first chicane deflector 111 in the direction of the X-axis at a point before the Z-axis meets neutrals blocking structure 130. Ion beam 170b is then deflected by beam blanking deflector 120 in a direction orthogonal to the Z-axis and also orthogonal to the direction of the deflection caused by first chicane deflector 111. At second chicane deflector 112, charged particle beam 170b is deflected such that the component of charged particle beam 170b in the X-Z plane becomes parallel with the Z-axis. At third chicane deflector 113, charged particle beam 170b is deflected onto a path that is terminated by beam blocking structure 150.

As shown in FIG. 2B, the deflection caused by first chicane deflector 111 directs charged particle beam 170b along a path in the X-Z plane that bypasses neutrals blocking structures 130 and 140. FIG. 2B also shows that the path of charged particle beam 170b, as projected on the X-Z plane, is the same as the path of the unblanked beam shown in FIG. 1B up to where charged particle beam 170 is intercepted by beam blocking structure 150. However, FIGS. 1C and 2C show that the additional deflection of charged particle beam 170b provided by beam blanking deflector 120 deflects charged particle beam 170b in the direction of the Y-axis, which causes charged particle beam 170b to be intercepted by beam blocking structure 150 rather than passing through beam blocking structure 150 (as charged particle beam 170a does in FIGS. 1A-1C). In an embodiment, beam blocking structure 150 comprises a faraday cup, which may be used to measure beam current of charged particle beam 170b in addition to blanking charged particle beam 170b.

FIGS. 3A-3C shows the mechanism by which CBA 100 blocks neutrals. Neutrals may enter CBA 100 with a charged particle beam or be generated inside CBA 100 by neutralization of ions of the charged particle beam. The neutrals are blocked by neutrals blocking structures 130 and 140 while charged particle beams (e.g., charged particle beams 170a and 170b) circumvent neutrals blocking structures 130 and 140 because neutrals, which have a zero-net charge, are not affected by the chicane and blanking deflections. The neutrals propagate down CBA 100 undeflected until reaching the first neutrals blocking structure 130. The first neutrals blocking structure 130, which extends across the Z-axis, blocks roughly half of neutrals 180 (in some embodiments, neutrals blocking structure 130 may block a higher proportion of neutrals by extending further across the neutrals path). The remaining portion of neutrals 180, shown as reduced-width beam 180b, continues down CBA 100 until reaching neutrals blocking structure 140. Neutrals blocking structure 140 extends further across the longitudinal cross-section of CBA 100 than neutrals blocking structure 130 in the direction of offset d (shown in FIG. 2B) and blocks the remaining portion 180b of neutrals 180.

Operating CBA 100 in blanking mode prevents charged particle beams and neutrals from passing through CBA 100, which may be useful, for example, in a dual FIB/SEM system during SEM scanning. In an embodiment, a FIB column of a SEM/FIB dual beam system is equipped with CBA 100 and configured to operate in unblanked mode when processing a workpiece with an ion beam of the FIB column and to operate in blanking mode when imaging the workpiece with the SEM. In an embodiment, a P-FIB column is equipped with CBA 100.

The operation of CBA 100 in blanking mode involves a blanking deflection that is perpendicular to both the direction of the chicane deflections and the Z-axis. By utilizing such a deflection, a longer throw distance is required between the blanker and the Faraday Cup. A longer throw distance allows for beam blanking to be accomplished using smaller deflection angles at the beam blanking deflector than would be the case if an inlet aperture of the beam blocking structure (e.g., an inlet of beam blocking structure 150 or the inlet of a Faraday Cup) were closer to the blanker (such as in between chicane deflectors 112 and 113). With a smaller deflection angle, lower blanking voltages may be used. Lower blanking voltages may enable faster blanking since typically a bottleneck of blanking speed is the voltage slew rate (in V/µs) driving the blanker plates. A lower blanking voltage also reduces the time it takes to reach the required blanking voltage. Thus, in some embodiments, CBA 100 operates at lower voltages than could otherwise be achieved in the absence the blanking deflection perpendicular to the chicane deflection and the Z-axis.

Instead of lowering the operating voltages, the longer throw distance can allow CBA 100 to be constructed with a shortened overall length and/or with shorter beam blanking plates (electrodes). Shorter beam blanking plates may allow for faster blanking speed because shorter plates will generally have less capacitance, less capacitance being another limitation on the slew rate of the voltages on the blanking plates. Shorter blanking plates may also make blanking "sharper" since the transit time through the blanker is less for shorter plates. Thus, in some embodiments, CBA 100 is constructed with an overall length and/or beam blanking plates shorter than could be used in a CBA not configured for blanking deflections perpendicular to the chicane deflection and the Z-axis that is otherwise equivalent. In still other embodiments, CBA 100 operates at lower voltages than could otherwise be achieved in the absence the blanking deflection perpendicular to the chicane deflection and the Z-axis and is constructed with an overall length and/or beam blanking plates shorter than could be used in a CBA not configured for blanking deflections perpendicular to the chicane deflection and the Z-axis that is otherwise equivalent.

Figure 4:
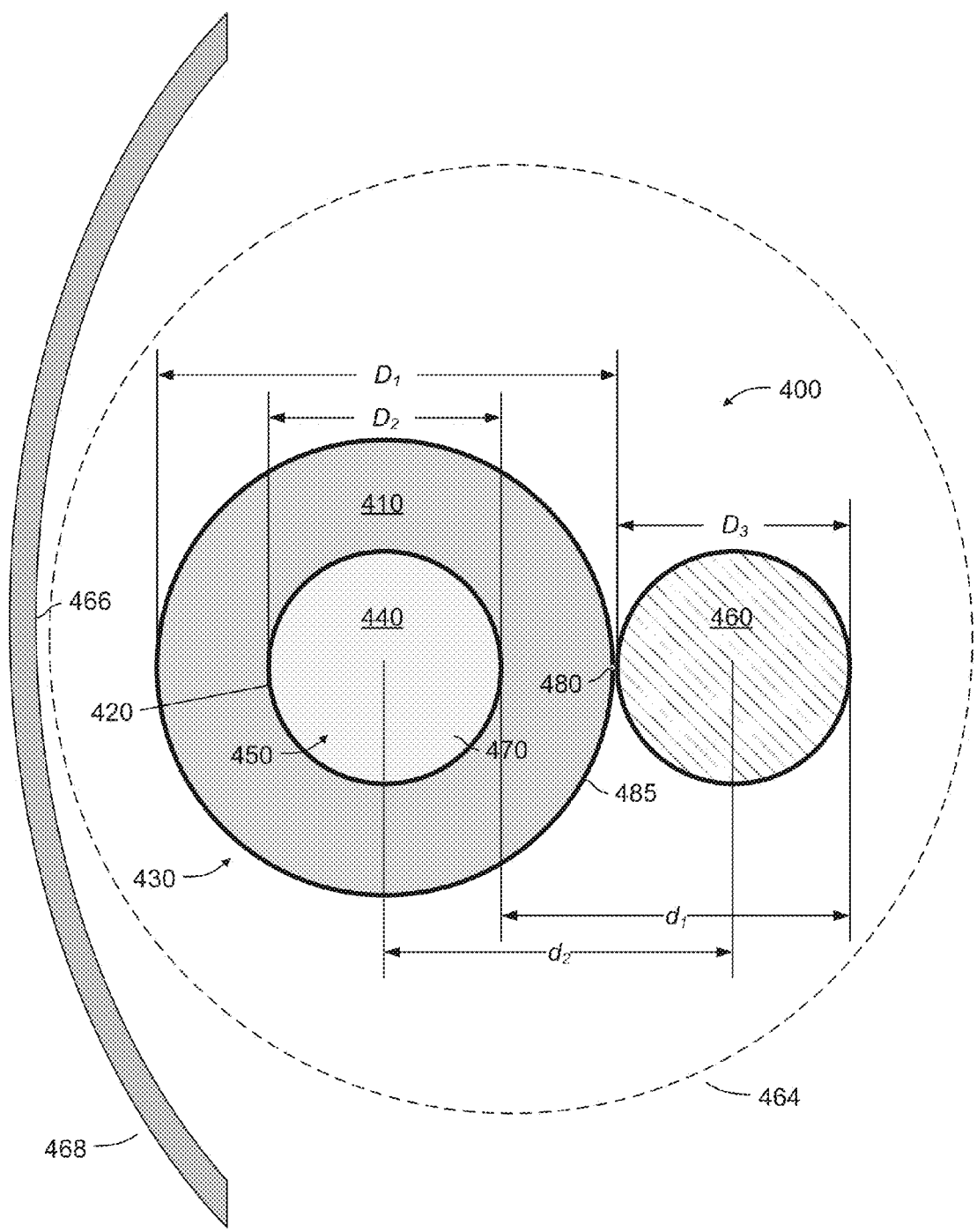
FIG. 4 is a radial cross-sectional view of a faraday cup of a chicane blanker assembly according to an embodiment of the disclosure.

Referring now to FIG. 4, a radial cross-sectional view of a Faraday cup 400 of a chicane blanker assembly according to an embodiment of the disclosure is shown. In various embodiments, Faraday cup 400 may be used as the beam blocking structure of the CBA. As used herein, a radial-cross sectional view refers to a cross-section taken across a plane normal to a longitudinal axis of the chicane blocker assembly. Faraday cup 400 comprises a cylindrical bore 410, a circular opening 420 at an end 430, and a circular plate 440 at an opposite end 450. Cylindrical bore 410 has an outside outer $D_1$ and an inner diameter $D_2$. Inner diameter $D_2$ defines an outer boundary of circular opening 420 at end 430. Circular plate 440 seals off opposite end 450, and may be integrally formed with cylindrical bore 410. In an embodiment, Faraday cup 400 is disposed inside the CBA at a periphery location 464 near an inside surface 466 of a housing 468 of the CBA, and the CBA deflects the charged particle beam 460 when operated in beam blanking mode.

During operation of the CBA in blanking mode, Faraday cup 400 accepts a charged particle beam that is deflected into bore 410 through opening 420. The charged particle beam passes through bore 410 towards end 450 and terminates at surface 470 of plate 440.

FIG. 4 also shows a charged particle beam 460 having a diameter $D_3$ and travelling into the plane of FIG. 4. Charged particle beam 460 is positioned adjacent to Faraday cup and thus FIG. 4 represents one spatial relationship between charged particle beam 460 and Faraday cup 400 inside the CBA when operated in unblanked mode. In order for charged particle beam 460 to be fully received through circular opening 420 during operation of the CBA in blanking mode, the CBA must deflect charged particle beam 460 by a distance sufficient for charged particle beam 460 to clear the wall of bore 410 before reaching Faraday cup 400. In FIG. 4, charged particle beam 460 propagates in an unblanked state in a direction parallel to the axis of Faraday cup 400 and along a path immediately adjacent to a tangent 480 of the outer surface 485 of Faraday cup 400. Thus, distance $d_1$ represents a minimum beam deflection required to blank charged particle beam 460 in the CBA. To illustrate a calculation of $d_1$, assume an outer diameter $D_1$ of 2 mm and an inner diameter $D_2$ of 1 mm for bore 410, and a beam diameter $D_3$ of 1 mm for charged particle beam 460. In this case, $d_1=D_3+(D_1-D_2)/2=1+(2-1)/2=1.5$ mm.

In some embodiments, optimal blanking may be obtained by deflecting charged particle beam 460 a sufficient distance to align the axis of charged particle beam 460 with the axis of Faraday cup 400 as charged particle beam 460 enters circular opening 420. In such embodiments, a minimum beam deflection $d_2$ required for optimal blanking would be the distance between the axes of Faraday cup 400 and charged particle beam 460.

In some embodiments, CBA 100 utilizes Faraday cup 400 instead of beam blocking structure 150 to blank charged particle beam 460. In some such embodiments, the offset between axis 170a and the Z-axis is greater than a distance required for charged particle beam 460 to bypass neutrals blocking structures 130, 140 and less than a distance that would cause charged particle beam 460 to intersect the Faraday cup. In one such embodiment, an outer diameter of a bore of the Faraday cup is about 2 mm in diameter, a diameter of the charged particle beam 460 is about 1 mm upon arrival to the longitudinal position of the Faraday cup, the offset between axis 170a and the Z-axis is greater than a distance required to bypass neutrals blocking structures 130, 140, and the distance between axis 170a and the center of the Faraday cup cross section is greater than 1.5 mm.

As described above, various embodiments of the CBA utilize a quadrupole deflector that functions as the beam blanking deflector and the first chicane deflector. In some such embodiments, the quadrupole is configured to carry out deflections, alone or in combination with one or more of the second, third, and fourth chicane deflectors, suitable for blanking the charged particle beam in blanking mode and for deflecting the charged particle beam around the neutrals blocking structures in the unblanked mode. In such embodiments, single pair and double pair deflections may be carried out by applying voltages to the appropriate deflectors at strengths and polarities sufficient to achieve the desired deflections.

Figure 5A:
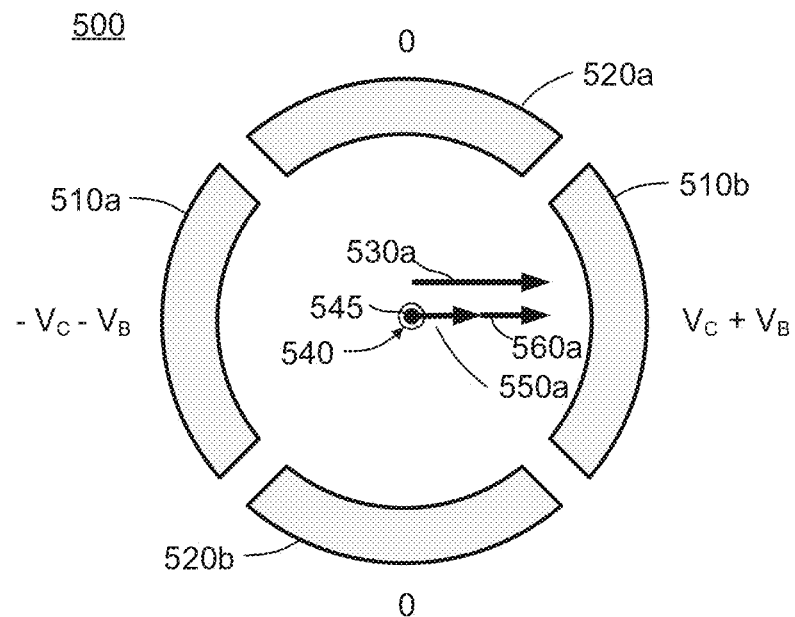
FIG. 5A is a radial cross-sectional view of a quadrupole of a chicane blanker assembly according to an embodiment of the disclosure.
Figure 5B:
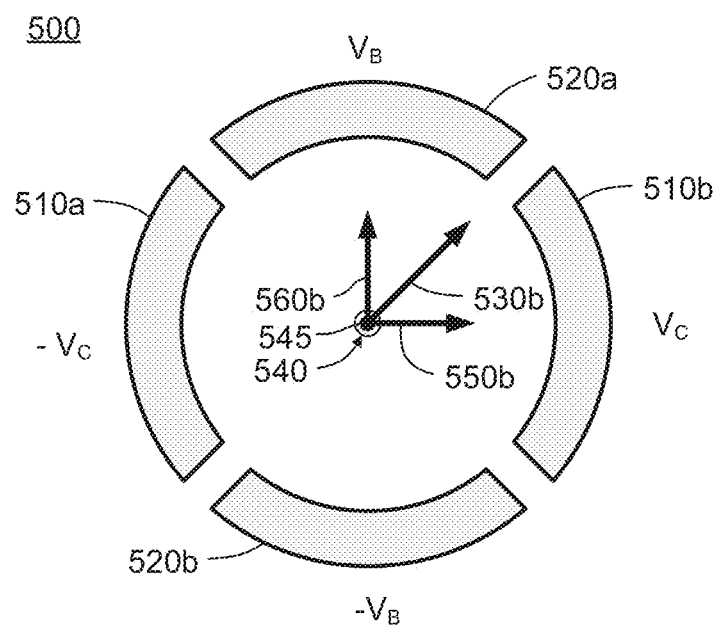
FIG. 5B is a radial cross-sectional view of a quadrupole of a chicane blanker assembly according to an embodiment of the disclosure.

Referring now to FIGS. 5A and 5B, a radial cross-sectional view of a quadrupole 500 of the CBA according to an embodiment of the disclosure is shown. Quadrupole 500 includes four electrodes 510a, 510b and 520a, 520b, which are arranged to carry out the functions of the first chicane blanker and the beam blanking deflector in a single deflector.

FIGS. 5A and 5B illustrate how chicane voltage $V_C$ and blanking voltage $V_B$ may be applied to electrodes 510a, 510b (with opposite signs as shown) and 520a, 520b (with opposite signs as shown) of quadrupole 500 to carry out beam blanking deflections 560a, 560b of a charged particle beam 540 propagating through quadrupole 500 along longitudinal axis 545 of the CBA, as well as chicane deflections 550a, 550b. Chicane voltage $V_C$ represents a voltage sufficient to cause chicane deflections 550a and 550b of charged particle beam 540 travelling along longitudinal axis 545. Blanking voltage $V_B$ represents a voltage that, when applied at the same time as with $V_C$ to electrodes 510a, 510b, or to electrodes 520a, 520c as shown in FIG. 5A or 5B, respectively, is sufficient to cause blanking deflections 560a, 560b of charged particle beam 540 travelling along longitudinal axis 545. In FIG. 5A, parallel deflections 550a and 550b linearly combine to produce net deflection 530a. In FIG. 5B, perpendicular deflections 550b and 560b combine vectorially to produce net deflection 530b. In the following explanations, the magnitude of chicane voltage $V_C$ is assumed to be approximately the same blanking voltage $V_B$ to simplify the explanation of the relationship between electrode voltages of quadrupole 500 and net combined chicane and blanking deflections 530a, 530b.

In FIG. 5A, chicane voltage $V_C$ and blanking voltage $V_B$ are applied to electrodes 510a and 510b while electrodes 520a and 520b remain grounded. The effect of adding the voltages on electrodes 510a and 510b is that the maximum voltage swing on electrodes 510a and 510b is larger than the voltage swing realized when applying either of chicane voltage $V_C$ or blanking voltage $V_B$ alone. The effect of chicane deflection 550a and blanking deflection 560a on charged particle beam 540 is that charged particle beam 540 is deflected a distance 530a, which is a distance sufficient to direct charged particle beam 540 into a beam blocking structure (not shown) of the CBA. In contrast, when only chicane voltage $V_C$ is applied to electrodes 510a and 510b, chicane deflection 550a offsets charged particle beam 540 from longitudinal axis 545 by a distance sufficient to put charged particle beam 540 on a path bypassing the neutrals blocking structures (not shown) of the CBA without being intercepted by the beam blocking structure.

In FIG. 5B, chicane voltage $V_C$ is applied to electrodes 510a and 510b and blanking voltage $V_B$ is applied to electrodes 520a and 520b. The effect on electrodes 510a, 510b, 520a, and 520b of applying the voltages to different pairs of electrodes is that the maximum voltage swing on any of electrodes 510a, 510b, 520a, and 520b is $\pm V_C$ or $\pm V_B$ because the voltages are not added. Thus, the maximum required voltage in FIG. 5B is smaller than what is required in FIG. 5A, assuming that the deflections achieved using the same values for chicane voltage $V_C$ and blanking voltage $V_B$ result in an overall deflection that successfully blanks the beam. Thus, the beam deflecting technique shown by FIG. 5B may be advantageous in applications where lower maximum swing voltages are desired.

In various embodiments, the CBA may be equipped with a quadrupole such as quadrupole 500 and used to carry out deflections for the blanking and unblanked modes instead of using separate beam blocking and first chicane deflectors. In some embodiments, CBA 100 is equipped with quadrupole 500 in place of chicane deflector 111 and beam blanking deflector 120. In some such embodiments, CBA 100 is operated according to one of the techniques described in connection with FIGS. 5A and 5B.

Figure 6:
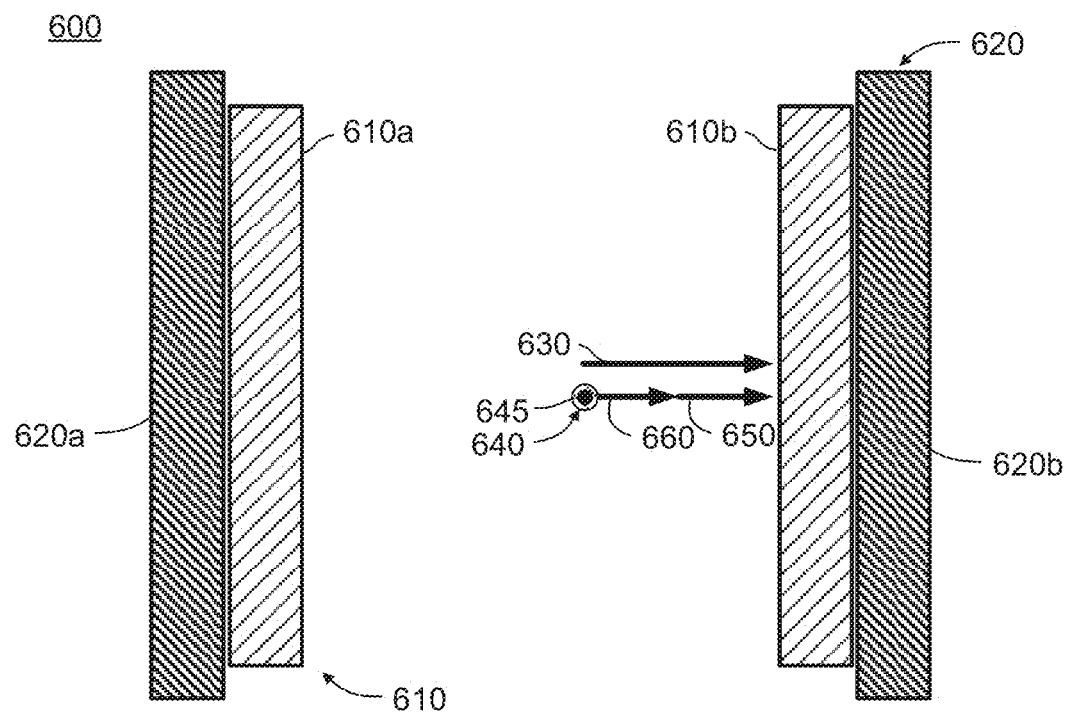
FIG. 6 is a radial cross-sectional view deflector assembly of a chicane blanker assembly according to an embodiment of the disclosure.

Also described above, in various embodiments the beam blanking deflector and the first chicane deflector each comprise two electrodes oppositely disposed at the same radial positions around the longitudinal axis and at the same distance from the entrance of the CBA. Referring now to FIG. 6, a radial-cross sectional view of a deflector assembly 600 in accordance with an embodiment is shown. Deflector assembly 600 is a combination of first chicane deflector 610 and beam blanking deflector 620—in this view, chicane deflector 610 is either above or below blanking deflector 620 when viewed along axis 645. First chicane deflector 610 includes electrodes 610a and 610b oppositely disposed about longitudinal axis 645 of the CBA (not shown). A voltage may be applied to first chicane deflector 610 such that a chicane deflection 660 deflects charged particle beam 640 off of longitudinal axis 645 and onto a path bypassing neutrals blocking structures (not shown) of the CBA. Beam blanking deflector 620 includes electrodes 620a and 620b oppositely disposed about longitudinal axis 645.

A blanking voltage may be applied to beam blanking deflector 620 while the chicane voltage is applied to first chicane deflector 610 such that charged particle beam 640 is deflected off of longitudinal axis 645 and onto a path that intersects a beam blocking structure (not shown). The above/below arrangement of beam blanking deflector 620 relative to first chicane deflector 610 allows the beam deflection 650 induced by beam blanking deflector 610 and the beam deflection 660 induced by chicane deflector 615 to be additively applied to the beam 640 In an alternative embodiment, the above/below positions of first chicane deflector 610 and beam blanking deflector 620 are switched.

In an illustrative embodiment, chicane deflection 660 and blanking deflection 650 each cause a 1.5 mm displacement in the same direction of beam 640 from longitudinal axis 645, making the blanking deflection 3.0 mm. In various embodiments, CBA 100 is equipped with deflector assembly 600 in place of chicane deflector 111 and beam blanking deflector 120. In some such embodiments, CBA 100 is operated as described in connection with FIG. 6.

Figure 7:
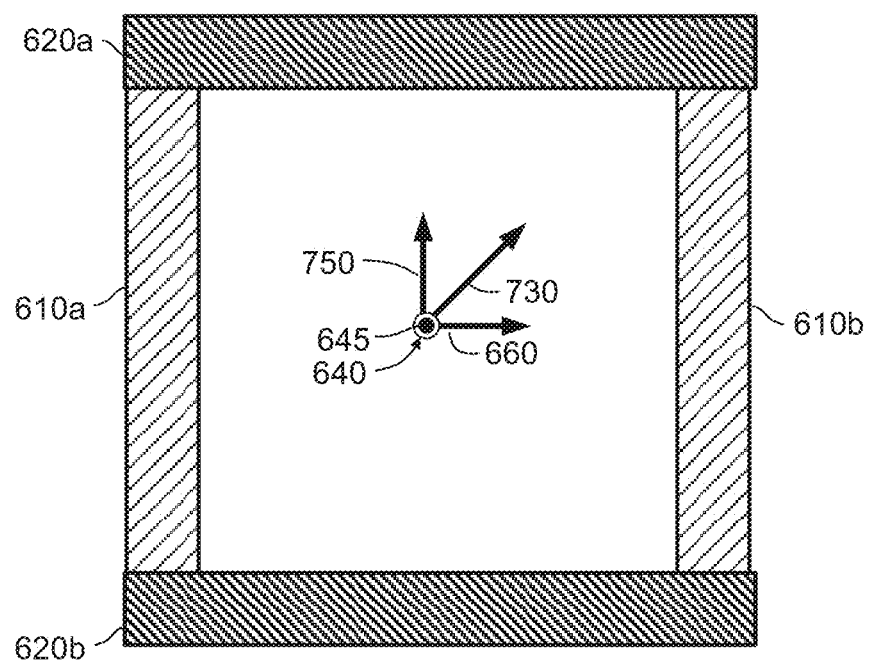
FIG. 7 is a radial cross-sectional view of a deflector assembly of a chicane blanker assembly according to an embodiment of the disclosure.

FIG. 7 is a radial cross-sectional view of a deflector assembly 700 of a chicane blanker configured to blank a charged particle beam using perpendicular deflections. As for FIG. 6, chicane deflector 610 is either above or below blanking deflector 620 when viewed along axis 645. FIG. 7 comprises the same components of deflector assembly 700, but is different in that electrodes 620a and 620b of beam blanking deflector 620 have been rotated 90 degrees clockwise about longitudinal axis 645. By applying the same voltages to charged particle beam 640 as applied in FIG. 6, charged particle beam 640 is deflected 1.5 mm by chicane deflection 660 and 1.5 mm in a direction 750 perpendicular to chicane deflection 660, causing a total deflection 730 of charged particle beam 640. The perpendicular 1.5 mm deflections add vectorially, thus the length of total deflection 730 is 2.1 mm, 0.9 mm less than the total deflection 630 shown in FIG. 6.

The shorter deflections that may be achieved by the configurations illustrated by quadrupole 500 and deflector assembly 700 may be advantageous in that the spacing between the electrodes of one or more of the chicane deflectors 111, 112, and 113 can be reduced, allowing smaller deflection voltages to be used to generate the same deflection electrostatic fields. Alternatively or additionally, the beam blanking deflector 120 can be shortened because the required deflection angle is less, thereby shortening the overall length of the chicane blanker assembly. Further, when a P-FIB system is equipped with embodiments of the CBA having a shorter gap between electrodes of the chicane deflectors 111, 112, and 113, and/or a shorter beam blanking deflector 120, the overall aberrations induced in the focused ion beams generated by the P-FIB system may be reduced. It is believed the overall aberrations may be reduced because using smaller deflector gaps may reduce aberrations of the chicane deflectors; because the amount of aberrations decreases with increasingly smaller deflection angles; and because a shorter chicane may reduce columbic-spreading (space charge) of charged particle beams. Thus, configurations of the CBA wherein perpendicular deflections of focused ion beams may be carried out during a beam blanking mode provide a way for the overall length of the CBA, and thus of the entire FIB column, to be shortened without increasing voltage requirements of the CBA.

In various embodiments, CBA 100 is equipped with deflector assembly 700 in place of chicane deflector 111 and beam blanking deflector 120. In some such embodiments, CBA 100 is operated as described in connection with FIG. 7.

In various embodiments, CBA is utilized in a FIB column and operation of the FIB column does not involve a crossover of focused ion beams directed into CBA. In some such embodiments, the focused ion beams directed into CBA have large diameters such as, for example, a diameter of 1 mm. In some such embodiments, the deflection achieved by the chicane deflectors needs to be slightly larger than the beam diameter to eliminate neutrals. For example, one suitable deflection for a 1 mm diameter focused ion beam is about 1.3 mm.

In various embodiments, the CBA does not comprise an energy filtering aperture. In various embodiments, the CBA does not comprise a line focus. In an embodiment, operation of CBA 100 does not involve a crossover of focused ion beams directed into CBA 100, CBA 100 does not comprise an energy filtering aperture, CBA 100 does not comprise a line focus, or any combination thereof.

Figure 8:
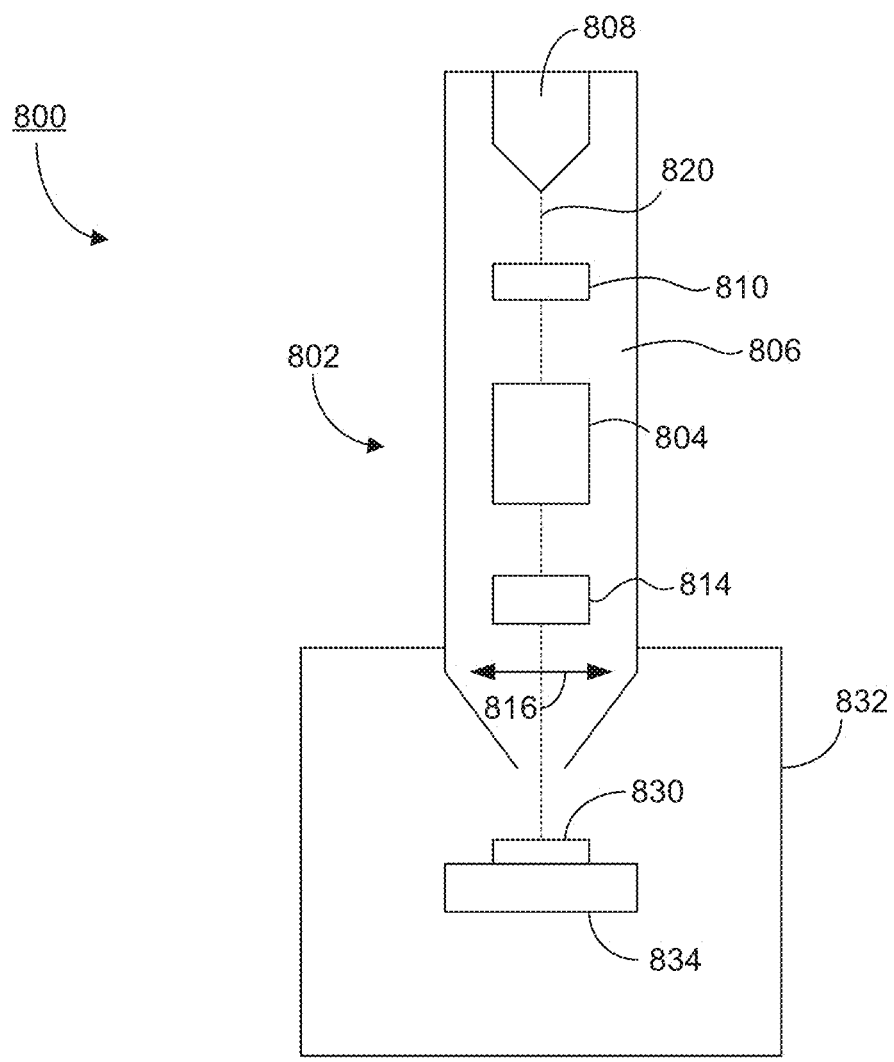
FIG. 8 is a schematic illustration of a particle optical apparatus according to an embodiment of the disclosure.

Also disclosed herein, are particle optical apparatuses configured to filter neutrals from charged particle beams generated by the particle optical apparatus. Referring now to FIG. 8, a charged particle beam system 800 with an ion beam column 802 and CBA 804 according to an embodiment of disclosure is shown. CBA 804 may be any of the CBAs disclosed herein, such as CBA 100. Ion beam column 802 includes an evacuated envelope 806 within which are located an ion source 808, extractor optics 810, CBA 804, beam deflectors 814, and a final lens 816. Ions from source 808 are extracted and formed into a beam 820 by extractor optics 810, and beam 820 then passes through CBA 804. CBA 804 can be used to filter out neutrals from beam 820, which may, for example, reduce or eliminate sample staining on a sample 830. Beam deflectors 814 scan the beam, which is then focused by final lens 816 onto sample 830 on a sample stage 834 within a vacuum chamber 832. Beam 820 can thus modify the sample by, for example, milling, chemically enhanced etching, material deposition, or imaging according to known methods.

Ion source 808 may be any ion source suitable for an ion beam apparatus, such as a plasma ion source, a LMIS that provides a beam of gallium ions, a multicusp ion source, or a combination thereof. Compared to ion beam devices utilizing LMIS sources, the sample staining mentioned above is significantly more pronounced in P-FIB systems because plasma sources operate at much higher gas pressures and are used to generate larger beam currents. In an embodiment, ion source 808 is a plasma ion source.

Figure 9:
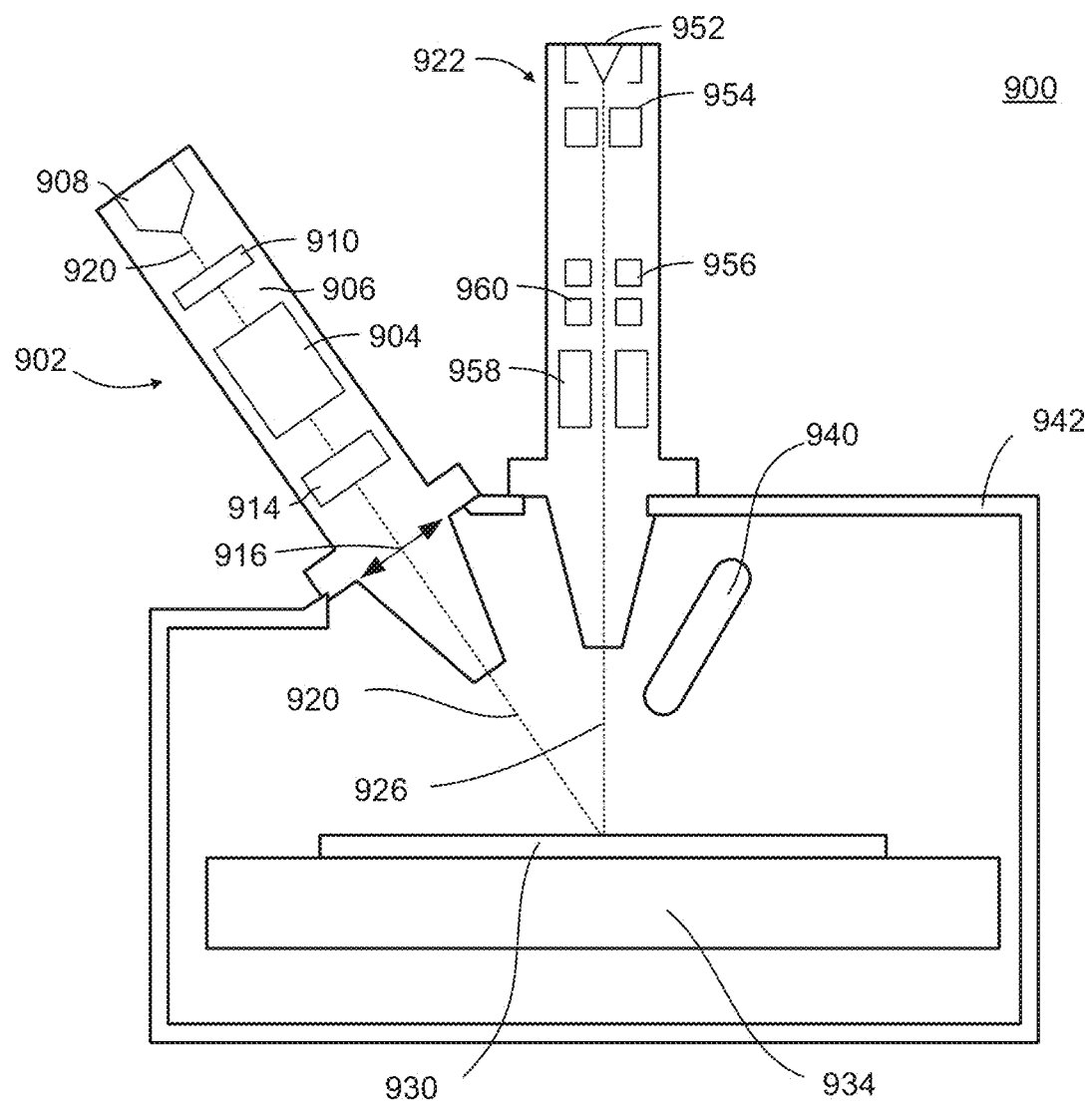
FIG. 9 is a schematic illustration of a dual charged particle beam system according to an embodiment of the disclosure.
Figure 10:
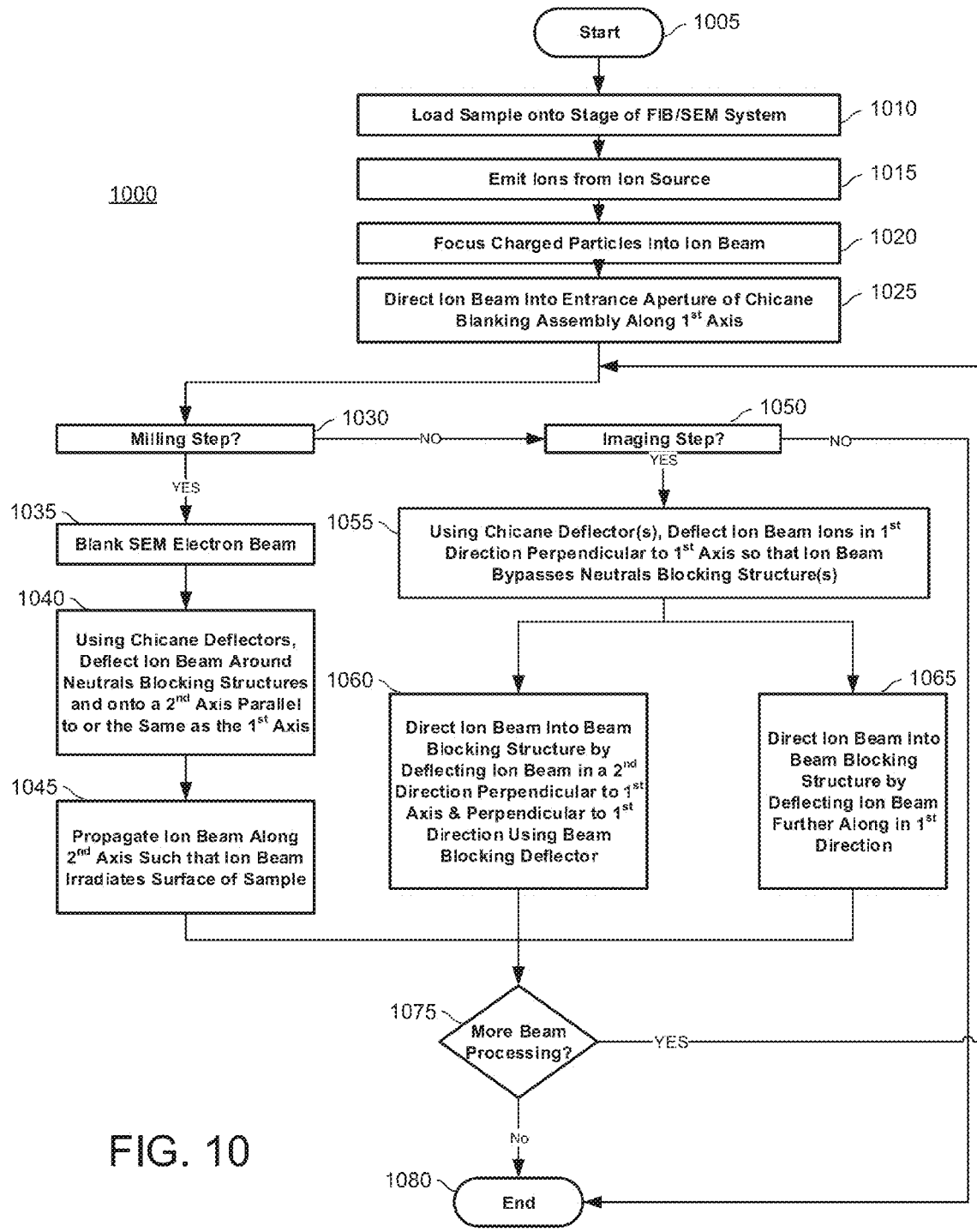
FIG. 10 is a flow diagram of a method of processing and imaging a workpiece according to an embodiment of the disclosure.

Also disclosed herein are dual beam SEM/FIB systems comprising a FIB configured to filter neutrals from charged particle beams generated by the FIB. Turning to FIG. 9, a dual beam system 900 utilizing a CBA 904 in accordance with an embodiment of the disclosure is shown. Dual beam system 900 includes an ion beam column 902, an electron beam column 922, a movable stage 934, and a vacuum chamber 942. Dual beam system 900 can be used to carry out any of the methods disclosed herein.

Ion beam column 902 includes CBA 904. CBA 904 may be any of the CBAs disclosed herein, such as CBA 100. Ion beam column 902 includes an evacuated envelope 906 within which are located an ion source 908, extractor optics 910, CBA 904, beam deflectors 914, and a final lens 916. Ion source 908 may be any ion source suitable for an ion beam apparatus, such as a plasma ion source, a LMIS that provides a beam of gallium ions, a multicusp ion source, or a combination thereof. Ions from source 908 are extracted and formed into a beam 920 by extractor optics 910, and beam 920 then passes through CBA 904. Beam deflectors 914 scan the beam 920, which is then focused by final lens 916 onto sample 930 on a sample stage 934 within a vacuum chamber 942. Beam 920 can thus modify the sample by, for example, milling, chemically enhanced etching, material deposition, or imaging according to known methods.

A scanning electron microscope 922 is also provided with the dual beam system 900. An electron beam 926 is emitted from a cathode 952 by applying voltage between cathode 952 and an anode 954. Electron beam 926 is focused to a fine spot on sample 930 by means of a condensing lens 956 and an objective lens 958. Electron beam 926 is scanned two-dimensionally on the specimen by means of deflectors 960. Operation of condensing lens 956, objective lens 958, and deflectors 960 is controlled by a power supply and a control unit (not shown). Electron beam 926 can be focused onto sample 930, which is on a sample stage 934 within vacuum chamber 942. When the electrons in the electron beam strike sample 930, secondary electrons are emitted. These secondary electrons are detected by secondary electron detector 940. The information obtained by secondary electron detector 940 can be used to image sample 930 while ion beam column 902 is blanked or deactivated.

Stage 934 can move in a horizontal plane (X and Y axes) and vertically (Z axis). Stage 934 can also tilt approximately sixty (60) degrees and rotate about the Z axis. A door (not shown) is opened for inserting sample 930 onto stage 934 and also for servicing an internal gas supply reservoir, if one is used. The door is interlocked so that it cannot be opened if the system is under vacuum. Vacuum pumps (not shown) are used to maintain vacuum conditions in vacuum chamber 942, vacuum envelope 906, and in the scanning electron microscope column.

CBA 904 can be used to filter out neutrals from beam 920, which may, for example, reduce or eliminate sample staining on a sample 930. CBA 904 can also be used to prevent image saturation while electron beam 926 acquires an image from sample 930. Such image saturation may be caused by neutrals passing through ion beam column 902 while ion beam 916 is blanked. Compared to ion beam devices utilizing LMIS sources, sample staining and image saturation are significantly more pronounced in P-FIB systems because plasma sources operate at much higher gas pressures and are used to generate larger beam currents. In an embodiment, ion source 908 is a plasma ion source and ion beam column 902 is a PFIB column. In some embodiments, CBA 904 is incorporated into the ion beam column of an existing dual beam system. Such dual beam systems are commercially available, for example, from FEI Company, Hillsboro, Oreg., the assignee of the present application.

Also disclosed herein, is a method 1000 for preventing neutrals from impacting a sample while processing the sample with a charged particle system. Although method 1000 may be carried out with other chicane blocker assemblies of the disclosure, for simplicity method 1000 will be illustrated herein using a dual beam FIB/SEM system equipped with CBA 100. Method 1000 may also be carried out with a dual beam system equipped with a CBA, such as dual beam system 900.

Method 1000 begins at Start block 1005, leading to Block 1010, loading a sample on a stage of a dual beam FIB/SEM system having an FIB column equipped with an embodiment of the CBA, such as CBA 100. Method 1000 continues to Block 1015 by emitting ions from an ion source. In an embodiment, the FIB column is a P-FIB column and the ion source is a plasma source. Method 1000 continues at Block 1020 by focusing the ions into an ion beam. Method 1000 continues at Block 1025 by directing the ion beam into CBA 100.

Method 1000 continues at Block 1030 by deciding whether to carry out a milling step is to be carried out by milling the sample with the FIB column. If a milling step is to be carried out, method 1000 proceeds to Block 1035. At Block 1035, the electron beam of the SEM is blanked. Method 1000 continues at Block 1040, where chicane deflectors 111-114 are used to deflect the ion beam around first neutrals blocking structure 130 and second neutrals blocking structure 140 and onto a second axis parallel to or the same as the first axis. In Block 1045, the ion beam irradiates the sample surface, thereby removing material in a FIB milling process.

From Block 1045, method 1000 proceeds to Block 1075 by determining whether additional beam processing is required. If more beam processing is not required, method 1000 proceeds to, and terminates at, End Block 1080. If more beam processing is required, the method returns to Block 1030.

It a milling step is not to be carried out, method 1000 proceeds from Block 1030 to Block 1050 by determining whether an imaging step is to be carried out by imaging the sample with the SEM. If an imaging step is not to be carried out method 1000 terminates at Block 1080. If a imaging step is to be carried out, method 1000 continues to Block 1055. At Block 1055, chicane deflectors 111, 112, 113, and 114 deflect the ion beam ions in a first direction perpendicular to the first axis such that the ion beam bypasses first neutrals blocking structure 130 and second neutrals blocking structure 140.

From Block 1055, method 1000 continues to either Block 1060 or Block 1065. If CBA 100 is configured to carry out perpendicular chicane and blanking deflections, method 1000 proceeds to Block 1060 by directing the ion beam into beam blocking structure 150 by deflecting the ion beam in a second direction perpendicular to the first axis and perpendicular to the first direction using the beam blanking deflector 120. If CBA 100 is configured to carry out parallel deflections, then method 1000 proceeds to Block 1065 by directing the ion beam into beam blocking structure 150. If CBA 100 is capable of both types of deflections, method 1000 may continue to either Block 1060 or Block 1065.

From Blocks 1060 or 1065, method 1000 proceeds to Block 1075 determine whether additional beam processing is required. If more beam processing is not required, method 1000 proceeds to, and terminates at, Block 1080. If more beam processing is required, method 1000 returns to Block 1030.

Various embodiments of the disclosure may be utilized to remove neutrals from focused ion beams of single beam and dual beam FIB systems. Various embodiments of the disclosure may be utilized to remove neutrals from focused ion beams of single-beam P-FIB systems as well as dual-beam systems. The removal of neutrals from focused ion and plasma-focused ion beams may advantageously reduce or eliminate sample staining caused by neutrals originating from FIB and P-FIB columns. Reductions in sample staining may be desirable, for example, in applications where samples and substrates are being processed on the nanometer scale, such samples being sensitive to sample damage/alteration (e.g., thin film samples may be easily damaged as a result of electron implantation or staining).

In dual FIB/SEM systems, including dual P-FIB/SEM systems, embodiments of the disclosure may reduce or eliminate "white-out" of images being acquired by the SEM. As a result, embodiments of the disclosure may provide improved SEM imaging performance in dual beam FIB/SEM systems, particularly in dual beam P-FIB/SEM systems, which may in turn provide improved imaging and end-pointing.

Furthermore, embodiments of the CBA utilize a configuration that allows for perpendicular deflections of the focused ion beams, which in turn allows the CBA to have a shorter column length and/or to utilize lower voltages to control the chicane deflectors and the beam blanking deflectors.

The following are nonlimiting, specific embodiments in accordance with the present disclosure:

A first embodiment, which is a chicane blanker assembly for a charged particle beam system, comprising an entrance and an exit, wherein the entrance is configured to accept a beam of charged particles propagating along an axis; a neutrals blocking structure intersecting the axis; a plurality of chicane deflectors comprising a first chicane deflector, a second chicane deflector, a third chicane deflector, and a fourth chicane deflector sequentially arranged in series between the entrance and the exit and configured to deflect the beam along a path that bypasses the neutrals blocking structure and exits the chicane blanker assembly through the exit; and a beam blocking structure arranged between the third chicane deflector and the fourth chicane deflector.

A second embodiment, which is the chicane blanker assembly of the first embodiment further comprising a beam blanking deflector configured to prevent the beam from passing through the exit by deflecting the beam into the beam blocking structure.

A third embodiment, which is the chicane blanker assembly of the second embodiment wherein the beam blanking deflector is disposed between the first chicane deflector and the second chicane deflector.

A fourth embodiment, which is the chicane blanker assembly of any of the second through third embodiments further comprising a quadrupole deflector, wherein the first chicane deflector comprises two oppositely opposed electrodes of the quadrupole deflector and the beam blanking deflector comprises another two oppositely opposed electrodes of the quadrupole deflector.

A fifth embodiment, which is the chicane blanker assembly of any of the second and fourth embodiments wherein the first chicane deflector and the beam blanking deflector are a same deflector and further comprising a voltage source configured to apply a first voltage to the same deflector sufficient to deflect the beam along a path bypassing the neutrals blocking structure and apply a second voltage to the same deflector sufficient to deflect the beam along a path that terminates in the beam blocking structure.

A sixth embodiment, which is the chicane blanker assembly of any of the second, third, and fifth embodiments wherein the first chicane deflector is configured to apply a first deflective force to the beam in a first direction, the first direction being perpendicular to the axis, and the beam blanking deflector is configured to apply a second deflective force to the beam in the first direction, wherein the first deflective force and the second deflective force are electrostatic forces.

A seventh embodiment, which is the chicane blanker assembly of any of the second through fifth embodiments wherein the first chicane deflector is configured to apply a first deflective force to the beam in a first direction, the first direction being perpendicular to the axis; and the beam blanking deflector is configured to apply a second deflective force to the beam in a second direction, the second direction being perpendicular to the axis and to the first direction, wherein the first deflective force and the second deflective force are electrostatic forces.

An eighth embodiment, which is the chicane blanker assembly of any of the first through seventh embodiments wherein the neutrals blocking structure is disposed upstream of the fourth chicane deflector.

A ninth embodiment, which is the chicane blanker assembly of any of the first through eighth embodiments wherein the neutrals blocking structure is a first neutrals blocking structure, further comprising a second neutrals blocking structure disposed upstream of the fourth chicane deflector, wherein the path that bypasses the first neutrals blocking structure bypasses the second neutrals blocking structure, and wherein the second neutrals blocking structure is configured to block charged particles neutralized along the path that bypasses the first neutrals blocking structure and the second neutrals blocking structure that are not blocked by the first neutrals blocking structure.

A tenth embodiment, which is the chicane blanker assembly of any of the first through ninth embodiments wherein the beam blocking structure comprises a Faraday cup.

An eleventh embodiment, which is the chicane blanker assembly of any of the first through tenth embodiments wherein the charged particle beam system comprises a plasma-focused ion beam column and the beam of charged particles comprises a plasma-focused ion beam.

A twelfth embodiment, which is a method for preventing neutrals from impacting a sample while processing the sample with a charged particle system, wherein:
the charged particle system comprises:
a charged particle source; and
a chicane blanker assembly comprising first, second, third, and fourth chicane deflectors arranged in series, a first neutrals blocking structure, a second neutrals blocking structure, and a beam blocking structure disposed between the third and fourth chicane deflectors, and
the method comprises:
irradiating a sample with a charged particle apparatus by:
emitting charged particles from a charged particle source,
focusing the charged particles into a charged particle beam propagating towards the sample along a first axis,
using the chicane deflectors to deflect the charged particle beam around the first neutrals blocking structure and the second neutrals blocking structure and then onto a second axis, the second axis being parallel to or the same as the first axis, and
propagating the charged particle beam along the second axis such that the charged particle beam irradiates a surface of the sample; and
preventing neutrals from impacting the sample using the chicane blanker assembly.

A thirteenth embodiment, which is the method of the twelfth embodiment wherein the second neutrals blocking structure comprises a plate overlapping a portion of a cross-section of the chicane blanker assembly normal to the first axis and blocking a portion of the chicane blanker assembly between the first axis and the second axis.

A fourteenth embodiment, which is the method of any of the twelfth through thirteenth embodiments wherein preventing neutrals from impacting the sample comprises blocking neutrals with at least one of the first neutrals blocking structure and the second neutrals blocking structure while the charged particle beam irradiates the sample such that the neutrals are prevented from staining the sample A fifteenth embodiment, which is the method of any of the twelfth through fourteenth embodiments wherein:
the charged particle apparatus comprises a focused ion beam column, the charged particle source comprises an ion source, and the charged particle beam comprises a focused ion beam;
the chicane blanker assembly further comprises a beam blanking deflector disposed at or downstream of a point where the focused ion beam enters the first chicane deflector and upstream of the beam blocking structure; and
the charged particle system further comprises a scanning electron microscope; and
further comprising simultaneously:
blanking the focused ion beam, wherein blanking the focused ion beam comprises applying a first deflective force to the focused ion beam with the first chicane deflector and applying a second deflective force to the focused ion beam with the beam blanking deflector;
blocking neutrals with at least one of the first neutrals blocking structure and the second neutrals blocking structure during the blanking of the focused ion beam such that the neutrals are prevented from generating secondary electrons at the surface of the sample; and
imaging the sample with the scanning electron microscope.

A sixteenth embodiment, which is the method of any of the twelfth through fifteenth embodiments wherein blanking the focused ion beam comprises deflecting the focused ion beam with electrostatic fields generated by the first chicane deflector, the second chicane deflector, the third chicane deflector, and the beam blanking deflector.

A seventeenth embodiment, which is the method of any of the fifteenth through sixteenth embodiments wherein a direction of the first deflective force is perpendicular to the first axis and a direction of the second deflective force is the same as the direction of the first deflective force.

An eighteenth embodiment, which is the method of any of the fifteenth through sixteenth embodiments wherein a direction of the first deflective force is perpendicular to the first axis and a direction of the second deflective force is perpendicular to the first axis and to the direction of the first deflective force.

A nineteenth embodiment, which is the method of any of the twelfth through eighteenth embodiments wherein the charged particle apparatus comprises a plasma focused ion beam column, the charged particle source comprises a plasma ion source, and the charged particle beam comprises a focused ion beam.

A twentieth embodiment, which is the method of any of the twelfth through nineteenth embodiments wherein the focused ion beam comprises a focused ion beam and a current of the focused ion beam is less than or equal to about 1.3 µA.

A twenty-first embodiment, which is the method of any of the nineteenth through twentieth embodiments wherein the neutrals comprise gas molecules emitted from the plasma source, ions of the focused ion beam neutralized in the plasma focused ion beam column, or a combination thereof.

A twenty-second embodiment, which is a charged particle beam system for processing a workpiece, comprising a focused ion beam column configured to generate, focus, and direct an ion beam, wherein the focused ion beam column includes:

an ion source;

an optical axis for propagating the ion beam from the ion source towards a workpiece; and a chicane blanker assembly comprising four chicane deflectors arranged in series, a blanking deflector, a first neutrals blocking structure, a second neutrals blocking structure, and a beam blocking structure, wherein:

the first neutrals blocking structure is configured to block neutrals propagating towards a workpiece along the optical axis;

the four chicane deflectors are configured to direct the beam onto the workpiece by deflecting the ion beam from the optical axis, onto a path bypassing the first neutrals blocking structure and the second neutrals blocking structure, and back onto the optical axis or an axis parallel to the optical axis;

the four chicane deflectors and the blanking deflector are configured to blank the ion beam by deflecting the ion beam into the beam blocking structure; and the second neutrals blocking structure is configured to block ions neutralized after being deflected from the optical axis.

A twenty-third embodiment, which is the charged particle beam system of the twenty-second embodiment wherein the chicane deflector closest to the ion source is configured to apply a first electrostatic field to the ion beam in a first direction perpendicular to the optical axis, and the blanking deflector is configured to apply a second electrostatic field to the ion beam in a second direction while the chicane deflector closest to the ion source applies the first electrostatic field.

A twenty-fourth embodiment, which is the charged particle beam system of the twenty-third embodiment wherein the second direction is parallel to or perpendicular to the first direction.

A twenty-fifth embodiment, which is the charged particle beam system of any of the twenty-second through twenty-fourth embodiments wherein the beam blocking structure comprises a faraday cup, and the ion source comprises a plasma source having a plasma chamber for containing a plasma, a source electrode for electrically biasing the plasma, and an extractor electrode for extracting ions from the plasma chamber.

A twenty-sixth embodiment, which is the charged particle beam system of any of the twenty-second through twenty-fifth embodiments further comprising a scanning electron microscope configured to image the workpiece while the chicane blanker assembly blanks the ion beam.

A twenty-seventh embodiment, which is the charged particle beam system of any of the twenty-second through twenty-sixth embodiments wherein there is no crossover of the beam in the chicane blanker assembly.

A twenty-eighth embodiment, which is the charged particle beam system of any of the twenty-second through twenty-seventh embodiments wherein the chicane blanker assembly does not comprise an aperture for shaping the beam.

A twenty-ninth embodiment, which is the charged particle beam system of any of the twenty-second through twenty-eighth embodiments wherein there are no focusing elements exerting any shaping of the beam into a round or line focus.

While embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible, and alternative embodiments that result from combining, integrating, and/or omitting features of the embodiments disclosed herein are also within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl and an upper limit, Ru, is disclosed, any number falling within the range is specifically disclosed. In particular, the following numbers within the range are specifically disclosed: $R=Rl+k*(Ru-Rl)$, wherein k is a variable ranging from 1 percent to 100 percent with a 1 percent increment, i.e., k is 1 percent, 2 percent, 3 percent, 4 percent, 5 percent, 50 percent, 51 percent, 52 percent, 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of the term "may" to introduce features of embodiments of the disclosure (e.g., "In an embodiment, the widget may be connected to a cog,") is intended to mean that embodiments reciting said features are considered to be within the scope of the invention and such embodiments shall be construed as being positively recited by the specification. However, use of the term "may" to introduce features of embodiments is not an indication that embodiments failing to recite said features are considered outside the scope of the invention. Use of broader terms such as "comprises," "includes," "having," etc. should be understood to provide support for narrower terms such as "consisting of," "consisting essentially of," "comprised substantially of," etc.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Detailed Description of the Embodiments is not an admission that it is prior art to the present invention, especially any reference that may have a publication date after the priority date of this application.

We claim as follows:

1. A chicane blanker assembly for a focused ion beam column of a charged particle beam system, comprising:
    an entrance and an exit, wherein the entrance is configured to accept a focused ion beam propagating along a first axis;
    a neutrals blocking structure intersecting the first axis;
    a plurality of electrostatic chicane deflectors comprising a first chicane deflector, a second chicane deflector, a third chicane deflector, and a fourth chicane deflector sequentially arranged in series between the entrance and the exit and configured to deflect the focused ion beam along a path that bypasses the neutrals blocking structure and exits the chicane blanker assembly through the exit along a second axis parallel to the first axis, wherein:
        the first chicane deflector is configured to deflect the focused ion beam off of the first axis at a point before the first axis intersects the neutrals blocking structure and onto the portion of the path that bypasses the neutrals blocking structure, and
        the fourth chicane deflector is configured to deflect the focused ion beam onto the second axis; and
    a beam blocking structure different from the neutrals blocking structure and arranged between the third chicane deflector and the fourth chicane deflector, the beam blocking structure configured to prevent the focused ion beam from passing through the exit during operation of the chicane blanker assembly in a blanking mode,
    a beam blanking deflector configured to prevent the focused ion beam from passing through the exit by deflecting the focused ion beam into the beam blocking structure, wherein the beam blanking deflector is a different structural element from the first chicane deflector, the second chicane deflector, the third chicane deflector, and the fourth chicane deflector;
    wherein the chicane blanker assembly does not comprise an aperture for shaping the beam.

2. The chicane blanker assembly of claim 1, wherein the beam blanking deflector is disposed between the first chicane deflector and the second chicane deflector.

3. The chicane blanker assembly of claim 1, further comprising a quadrupole deflector, wherein the first chicane deflector comprises two oppositely opposed electrodes of the quadrupole deflector and the beam blanking deflector comprises another two oppositely opposed electrodes of the quadrupole deflector.

4. The chicane blanker assembly of claim 1, wherein:
    the first chicane deflector is configured to apply a first deflective force to the focused ion beam in a first direction, the first direction being perpendicular to the first axis; and
    the beam blanking deflector is configured to apply a second deflective force to the focused ion beam in the first direction,
    wherein the first deflective force and the second deflective force are electrostatic forces.

5. The chicane blanker assembly of claim 1, wherein:
    the first chicane deflector is configured to apply a first deflective force to the focused ion beam in a first direction, the first direction being perpendicular to the first axis; and
    the beam blanking deflector is configured to apply a second deflective force to the focused ion beam in a second direction, the second direction being perpendicular to the first axis and to the first direction, wherein the first deflective force and the second deflective force are electrostatic forces.

6. The chicane blanker assembly of claim 1, wherein the neutrals blocking structure is disposed upstream of the fourth chicane deflector.

7. The chicane blanker assembly of claim 6, wherein the neutrals blocking structure is a first neutrals blocking structure,
    further comprising a second neutrals blocking structure disposed upstream of the fourth chicane deflector,
    wherein the path that bypasses the first neutrals blocking structure bypasses the second neutrals blocking structure, and
    wherein the second neutrals blocking structure is configured to block charged particles neutralized along the path that bypasses the first neutrals blocking structure and the second neutrals blocking structure that are not blocked by the first neutrals blocking structure.

8. The chicane blanker assembly of claim 1, wherein the beam blocking structure comprises a Faraday cup.

9. The chicane blanker assembly of claim 1, wherein the focused ion beam column comprises a plasma-focused ion beam column and the focused ion beam comprises a plasma-focused ion beam.

10. The chicane blanker assembly of claim 1, wherein the second axis overlaps the first axis.

11. The chicane blanker assembly of claim 1, wherein the beam blanking deflector is configured to deflect the focused ion beam outside of the plane containing the first and second axes.

* * * * *